(12) United States Patent
Baba et al.

(10) Patent No.: US 9,362,325 B2
(45) Date of Patent: Jun. 7, 2016

(54) SEMICONDUCTOR DEVICE AND ELECTRONIC APPLIANCE

(71) Applicant: SONY CORPORATION, Tokyo (JP)

(72) Inventors: Koichi Baba, Kanagawa (JP); Takashi Kubodera, Kumamoto (JP); Toshihiko Miyazaki, Kanagawa (JP); Hiroaki Ammo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/429,454

(22) PCT Filed: Sep. 19, 2013

(86) PCT No.: PCT/JP2013/075293
§ 371 (c)(1),
(2) Date: Mar. 19, 2015

(87) PCT Pub. No.: WO2014/050694
PCT Pub. Date: Apr. 3, 2014

(65) Prior Publication Data
US 2015/0221694 A1    Aug. 6, 2015

(30) Foreign Application Priority Data

Sep. 28, 2012  (JP) ................................. 2012-218098
Feb. 14, 2013  (JP) ................................. 2013-026749

(51) Int. Cl.
H01L 27/146 (2006.01)
(52) U.S. Cl.
CPC ...... *H01L 27/14634* (2013.01); *H01L 27/1462* (2013.01); *H01L 27/1464* (2013.01); *H01L 27/1469* (2013.01); *H01L 27/14636* (2013.01)
(58) Field of Classification Search
CPC ..................... H01L 21/2007; H01L 27/14634; H01L 27/1469
See application file for complete search history.

(56) References Cited

U.S. PATENT DOCUMENTS 6,764,951 B1* 7/2004 van Ngo ....................... 438/687
2005/0121707 A1* 6/2005 Sekiguchi ......... H01L 27/14632
                                                    257/290

(Continued)

FOREIGN PATENT DOCUMENTS

JP          9-293698 A    11/1997
JP       2009-188068 A     8/2009

(Continued)

OTHER PUBLICATIONS

International Search Report prepared by the Japanese Patent Office on Dec. 3, 2013, for International Application No. PCT/JP2013/075293.

*Primary Examiner* — Bryan Junge
(74) *Attorney, Agent, or Firm* — Sheridan Ross P.C.

(57) ABSTRACT

The present technique relates to a semiconductor device and an electronic appliance in which the reliability of the fine transistor can be maintained while the signal output characteristic is improved in a device formed by stacking semiconductor substrates.

The semiconductor device includes a first semiconductor substrate, a second semiconductor substrate providing a function different from a function provided by the first semiconductor substrate, and a diffusion prevention film that prevents diffusion of a dangling bond terminating atom used for reducing the interface state of the first semiconductor substrate and the second semiconductor substrate, wherein at least two semiconductor substrates are stacked and the semiconductor substrates are electrically connected to each other, and the first semiconductor substrate and the second semiconductor substrate are stacked with the diffusion prevention film inserted between an interface of the first semiconductor substrate and an interface of the second semiconductor substrate.

16 Claims, 17 Drawing Sheets

(56) References Cited

U.S. PATENT DOCUMENTS

| | | | |
|---|---|---|---|
| 2008/0083939 A1* | 4/2008 | Guidash | H01L 27/14634 257/292 |
| 2009/0224345 A1* | 9/2009 | Lee | H01L 27/14687 257/432 |
| 2010/0238331 A1* | 9/2010 | Umebayashi et al. | 348/294 |
| 2012/0056288 A1* | 3/2012 | Yoshihara et al. | 257/431 |
| 2012/0199930 A1* | 8/2012 | Hayashi | H01L 27/1461 257/435 |
| 2014/0042299 A1* | 2/2014 | Wan | H01L 27/14609 250/208.1 |

FOREIGN PATENT DOCUMENTS

| | | |
|---|---|---|
| JP | 2010-245506 | 10/2010 |
| JP | 2011-119543 A | 6/2011 |
| WO | WO 2012004965 A1 * | 1/2012 |

* cited by examiner

FIG. 3
A
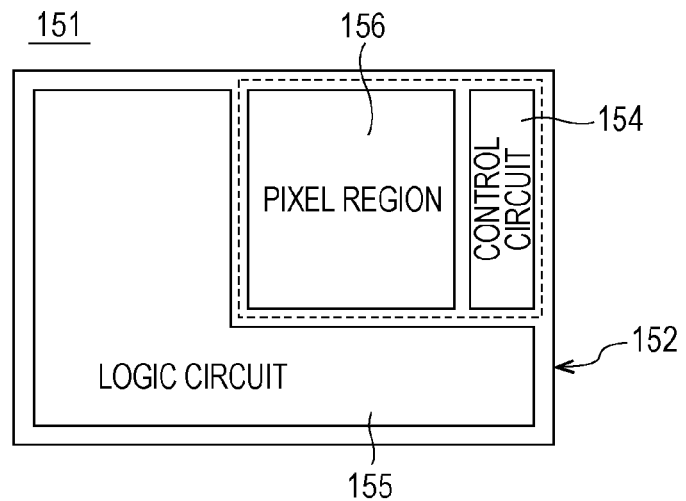
B
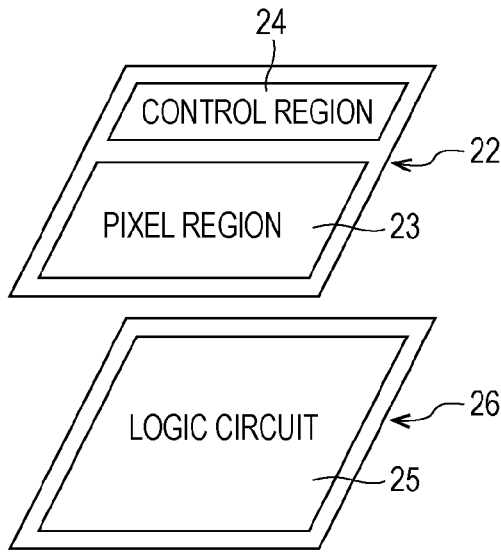
C
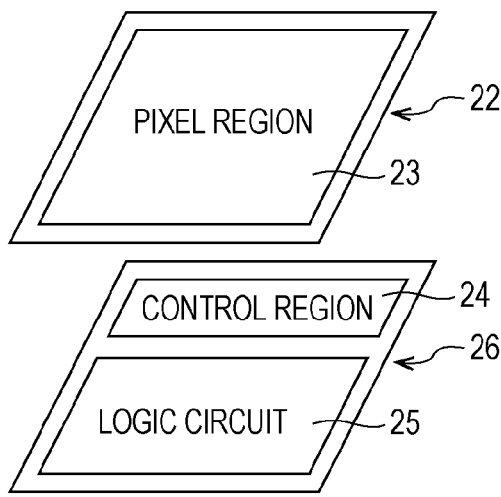

SEMICONDUCTOR DEVICE AND ELECTRONIC APPLIANCE

CROSS REFERENCE TO RELATED APPLICATIONS

This application is a national stage application under 35 U.S.C. 371 and claims the benefit of PCT Application No. PCT/JP2013/075293 having an international filing date of Sep. 19, 2013, which designated the United States, which PCT application claimed the benefit of Japanese Patent Application No. 2012-218098 filed Sep. 28, 2012, and Japanese Patent Application No. 2013-026749 filed Feb. 14, 2013, the disclosures of which are incorporated herein by reference in their entirety.

TECHNICAL FIELD

The present technique relates to a semiconductor device and an electronic appliance, and particularly to a semiconductor device and an electronic appliance, which are formed by stacking semiconductor substrates and in which the reliability of fine transistors can be maintained while the signal output characteristic is improved.

BACKGROUND ART

In regard to a conventional solid-state imaging element, it is important to reduce the dark current on a surface of a semiconductor substrate, which causes the deterioration in image quality, and to improve the characteristic of the flicker noise or random telegraph noise of a pixel transistor in a CCD or CMOS image sensor.

One cause of the dark current is the increase of the interface state of the semiconductor substrate due to the plasma damage from UV irradiation or charge-up in the plasma treatment (CVD or dry etching) in the process of manufacturing the solid-state imaging element.

For improving the pixel characteristic of the image sensor by reducing the dark current, atoms of hydrogen or fluorine have been used to terminate the dangling bonds at the device interface.

For example, there is a technique in which the dark current on a surface of a photodiode, which is a light reception element of a semiconductor substrate, is reduced by separating hydrogen from a passivation film (SiN film) and coupling the hydrogen with a dangling bond on the surface.

In the conventional structure, however, hydrogen is supplied to the entire semiconductor substrate including a pixel portion and a peripheral circuit portion; therefore, if the amount of supplying hydrogen to the pixel portion is secured, the amount of supplying hydrogen to the fine transistor in the peripheral circuit portion becomes excessive, in which case a problem occurs in that hydrogen is in excess on the semiconductor substrate surface side to deteriorate NBTI (Negative Bias Temperature Instability).

In view of the above, a technique has been suggested in which the passivation film that supplies hydrogen is set to contain a different amount of hydrogen in the pixel portion and in the peripheral circuit portion so that the amount of hydrogen supplied from the passivation film to the semiconductor surface portion is separately controlled in the pixel portion and in the peripheral circuit portion by the sinter process (for example, see Patent Document 1).

Moreover, in recent years, various types of solid-state imaging devices have been suggested in which: one device is configured by electrically connecting a semiconductor chip whose pixel region is formed by arranging a plurality of pixels and a semiconductor chip including a logic circuit for signal processing. For example, a semiconductor module in which a rear surface irradiation type image sensor chip and a signal processing chip provided with a signal processing circuit are connected to each other with a micro-bump has been suggested.

In other words, a number of image sensors formed by stacking semiconductor chips (semiconductor substrates) have been developed.

In regard to the image sensor formed by stacking the semiconductor chips in this manner, a manufacturing method for a semiconductor device has been suggested in which: a first semiconductor wafer and a second semiconductor wafer, which are semi-finished products and respectively include a pixel array and a logic circuit, are bonded to each other; the first semiconductor wafer is thinned; the electric connection is made between the pixel array and the logic circuit; and then the product is finished as a chip and provided as a rear surface irradiation type solid-state imaging device (see, for example, Patent Document 2).

CITATION LIST

Patent Document

Patent Document 1: Japanese Patent Application Laid-Open No. 2009-188068
Patent Document 2: Japanese Patent Application Laid-Open No. 2010-245506

SUMMARY OF THE INVENTION

Problems to be Solved by the Invention

In the conventional technique, however, it has been difficult to control the hydrogen concentration in the pixel portion and in the peripheral circuit accurately when manufacturing the image sensor or the like by stacking semiconductor substrates. For example, if the hydrogen concentration of the pixel region is increased by the sinter process as disclosed in Reference 1, the element reliability such as NBTI and HCl is deteriorated in the fine transistor used in the peripheral circuit.

In particular, in the case of the image sensor formed by stacking the semiconductor substrates, the stacked substrates necessarily include a film containing hydrogen, and the step of bonding the substrates is followed by the heat treatment of 200° C. to 400° C. performed in the state that the substrates are stacked. Therefore, the hydrogen concentration of the entire stacked substrates is homogenized; accordingly, it has been difficult to maintain the reliability of the fine transistor while improving the pixel characteristic.

The present technique is disclosed in view of the above circumstances and provides a device formed by stacking the semiconductor substrates wherein the reliability of the fine transistor is maintained while the signal output characteristic is improved.

Solutions to Problems

According to a first aspect of the present technique, there is provided a semiconductor device including: a first semiconductor substrate; a second semiconductor substrate providing a function different from a function provided by the first semiconductor substrate; and a diffusion prevention film that prevents diffusion of a dangling bond terminating atom used for reducing interface state of the first semiconductor substrate and the second semiconductor substrate, wherein at least two semiconductor substrates are stacked and the semiconductor substrates are electrically connected to each other, and the first semiconductor substrate and the second semiconductor substrate are stacked with the diffusion prevention film inserted between an interface of the first semiconductor substrate and an interface of the second semiconductor substrate.

It is possible that the interface state of the first semiconductor substrate is lower than that of the second semiconductor substrate.

It is possible that an atom supply film that supplies the dangling bond terminating atom is further inserted between the first semiconductor substrate and the diffusion prevention film.

It is possible that the dangling bond terminating atom is hydrogen, and an insulating thin film in the first semiconductor substrate formed by a silicon nitride thin film is used as the atom supply film.

It is possible that the first semiconductor substrate and the second semiconductor substrate are stacked with an atom occlusion film that occludes the dangling bond terminating atom inserted between the diffusion prevention film and the second semiconductor substrate.

It is possible that the dangling bond terminating atom is hydrogen, and barrier metal covering a multilayer wiring layer or an extraction electrode in the second semiconductor substrate, which is formed of titanium, is used as the atom occlusion film.

It is possible that the device is structured as a solid-state imaging device, and a pixel portion is provided for the first semiconductor substrate and a logic circuit is provided for the second semiconductor substrate.

It is possible that the semiconductor device further includes a third semiconductor substrate provided with a memory circuit, wherein the second semiconductor substrate is provided between the first semiconductor substrate and the third semiconductor substrate, and the first semiconductor substrate to the third semiconductor substrate are stacked with the diffusion prevention film that prevents diffusion of the dangling bond terminating atom further inserted between an interface of the second semiconductor substrate and an interface of the third semiconductor substrate.

It is possible that the diffusion prevention film is a SiN film formed by plasma CVD.

It is possible that the diffusion prevention film is formed on a support substrate by a film formation process at 600° C. or more, the diffusion prevention film formed on the support substrate and the second semiconductor substrate are bonded to each other and the support substrate is polished to be removed, and the first semiconductor substrate and the second semiconductor substrate are stacked with the diffusion prevention film inserted between the interface of the first semiconductor substrate and the interface of the second semiconductor substrate.

It is possible that the diffusion prevention film is a SiN film formed by LP-CVD.

It is possible that the diffusion prevention film has a film density of 2.7 g/cm to 3.5 g/cm.

It is possible that the diffusion prevention film has a thickness of 150 nm or less.

It is possible that the diffusion prevention film is a SiN film formed by ALD-CVD.

It is possible that the first semiconductor substrate and the second semiconductor substrate are stacked with their multilayer wiring layers facing each other.

It is possible that the first semiconductor substrate and the second semiconductor substrate are stacked with their multilayer wiring layers not facing each other.

According to a second aspect of the present technique, there is provided an electronic appliance including: a first semiconductor substrate; a second semiconductor substrate providing a function different from a function provided by the first semiconductor substrate; and a diffusion prevention film that prevents diffusion of a dangling bond terminating atom used for reducing the interface state of the first semiconductor substrate and the second semiconductor substrate, wherein at least two semiconductor substrates are stacked and the semiconductor substrates are electrically connected to each other, and the first semiconductor substrate and the second semiconductor substrate are stacked with the diffusion prevention film inserted between an interface of the first semiconductor substrate and an interface of the second semiconductor substrate.

According to the first aspect and the second aspect of the present technique, at least two semiconductor substrates are stacked, the semiconductor substrates are connected electrically to each other, and the first semiconductor substrate and the second semiconductor substrate are stacked with the diffusion prevention film inserted between the interface of the first semiconductor substrate and the interface of the second semiconductor substrate.

Effects of the Invention

According to the present technique, in the device formed by stacking the semiconductor substrates, the reliability of the fine transistor can be maintained while the signal output characteristic is improved.

BRIEF DESCRIPTION OF DRAWINGS

FIG. 3 is a diagram illustrating a fundamental schematic structure of a solid-state imaging device according to an embodiment of the present technique.

MODE FOR CARRYING OUT THE INVENTION

An embodiment of the technique disclosed herein is described hereinafter with reference to drawings.

First, the problem of the conventional technique is described.

For example, in the case of forming a MOSFET, a metal electrode is connected to a source and a drain on a semiconductor substrate (semiconductor wafer) generally formed of silicon (Si).

Here, the surface of silicon (Si) is oxidized into a silicon dioxide (SiO2) film. Note that the SiO2 film is also referred to as a gate oxide film.

At the interface between Si and SiO2, the number of bonds of the atoms does not coincide perfectly; thus, uncoupled bonds of Si or oxygen (dangling bonds) remain. In this portion, electrons or holes in Si are easily captured.

It has been known that the dangling bonds at the interface between different substances, which serve to capture electrons or holes, affect the semiconductor element characteristic called the interface state.

If the interface state is present at the interface between the gate oxide film and the Si substrate of a pixel transistor, for example, the characteristic such as flicker noise or random telegraph noise in the pixel transistor is deteriorated.

Moreover, it has been known that if the interface state is present on the surface of the Si substrate provided with a PD, for example, current flows through the interface state and the dark current characteristic in the solid-state imaging device using the PD is deteriorated.

For example, the interface state of the semiconductor substrate is increased by the plasma damage from the charge-up or the UV irradiation in the plasma treatment (CVD or dry etching) in the process of manufacturing the solid-state imaging element. The occurrence of the dark current and the flicker noise or the random telegraph noise of the pixel transistor deteriorates the image quality of the solid-state imaging element such as the image sensor.

For improving the pixel characteristic of the image sensor by reducing the dark current and the flicker noise or the random telegraph noise of the pixel transistor, the dangling bonds at the device interface are terminated with the atoms of hydrogen or fluorine.

For example, there is a technique in which the dark current on the surface of the photodiode serving as a light reception element of the semiconductor substrate is reduced by separating hydrogen from the passivation film (SiN film) and coupling the hydrogen with the dangling bonds on the surface. There is another technique in which the flicker noise or the random telegraph noise is reduced by the coupling with the dangling bonds of the interface between the gate oxide film of the pixel transistor and the semiconductor substrate.

Figure 1:
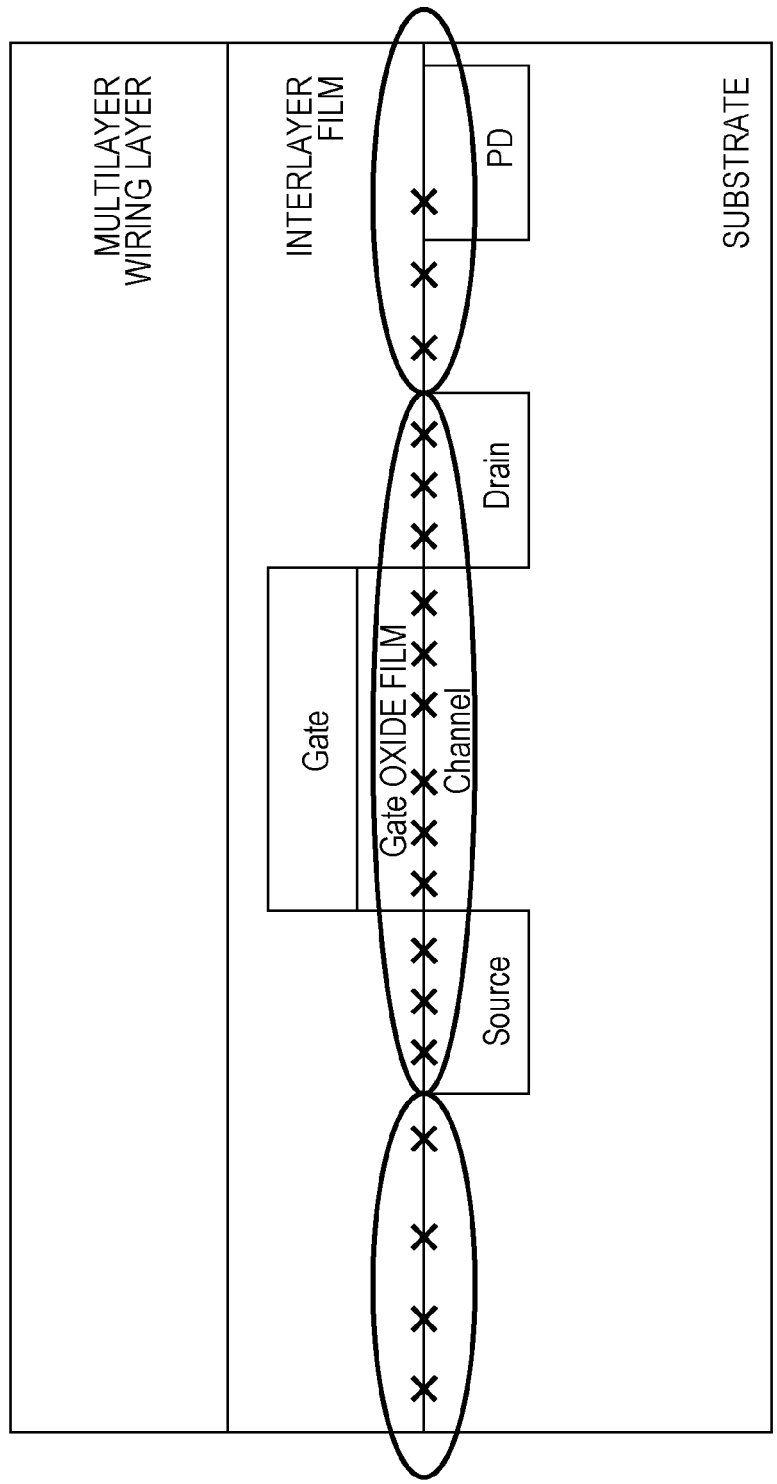
FIG. 1 is a diagram illustrating a general structure example of a semiconductor substrate of a MOSFET.

FIG. 1 is a diagram illustrating a general structure example of a semiconductor substrate included in a pixel portion. As illustrated in this drawing, this semiconductor substrate is formed by forming an interlayer film on a substrate made of silicon and a multilayer wiring layer on the interlayer film.

In this drawing, a transistor is formed at the center of the drawing, and a gate oxide film is formed on the substrate and a gate electrode is formed on the gate oxide film. On the surface of the substrate, a source electrode, a channel, a drain electrode, and a PD (photodiode) are formed.

In FIG. 1, the portion including cross marks corresponds to the interface of the semiconductor substrate. In other words, the surface in a horizontal direction parallel to the interface between the gate oxide film and the channel in the drawing corresponds to the interface. As described above, it is possible to terminate the dangling bond at this interface to reduce the interface state, thereby preventing the dark current and the flicker noise or the random telegraph noise of the pixel transistor.

However, in the case of terminating the dangling bond with hydrogen or the like, other problem than the dark current and the flicker noise or the random telegraph noise of the pixel transistor may occur.

For example, if hydrogen is supplied to the entire semiconductor substrate including the pixel portion and the peripheral circuit portion, hydrogen is supplied excessively to the fine transistor in the peripheral circuit portion, in which case the deterioration in NBTI (Negative Bias Temperature Instability) occurs.

The dangling bond at the SiO2-Si interface is deactivated by hydrogen to be present as Si—H; however, by the presence of the hole and the high-temperature/high-bias stress, the electrochemical reaction occurs so that hydrogen may be released. On this occasion, the dangling bonds (Si+) turn into the interface state and hydrogen is diffused into the gate oxide film.

In this case, part of hydrogen diffusing in the gate oxide film forms a trap. It is considered that the increase in interface state and the trap in the oxide film would deteriorate NBTI.

Moreover, it is considered that if hydrogen released at the interface is diffused into the gate oxide film, the hot carrier deterioration (CHI) is accelerated or the flicker noise due to the dangling bond is caused.

On the other hand, in recent years, various types of solid-state imaging devices have been suggested in which: one device is configured by electrically connecting a semiconductor chip whose pixel region is formed by arranging a plurality of pixels and a semiconductor chip including a logic circuit for signal processing. For example, a semiconductor module in which a rear surface irradiation type image sensor chip and a signal processing chip provided with a signal processing circuit are connected to each other with a micro-bump has been suggested.

That is to say, a number of image sensors formed by stacking semiconductor chips (semiconductor substrates) have been developed.

In the conventional technique, however, it has been difficult to control the hydrogen concentration in the pixel portion and in the peripheral circuit accurately in the process of manufacturing the image sensor or the like by stacking semiconductor substrates. For example, if the hydrogen concentration of the pixel region is increased by the sinter process, the element reliability such as NBTI and HCl is deteriorated in the fine transistor used in the peripheral circuit.

In particular, in the case of the image sensor formed by stacking the semiconductor substrates, the stacked substrates necessarily include a film containing hydrogen, and the step of bonding the substrates is followed by the heat treatment of 200° C. to 400° C. performed in the state that the substrates are stacked. Therefore, the hydrogen concentration of the entire stacked substrates is homogenized.

As thus described, in the conventional technique, the improvement of image quality and the maintenance of the reliability of the fine transistor in the stacked type solid-state imaging device are in the trade-off relation; thus, it has been difficult to achieve the both.

As a result, for example, a technique has been desired that can reduce the interface state in only the semiconductor substrate having the pixel portion.

In view of the above, in the present technique, for example, the interface state is reduced, the image quality is improved, and the reliability of the fine transistor is maintained in only the semiconductor substrate with the pixel portion.

Figure 2:
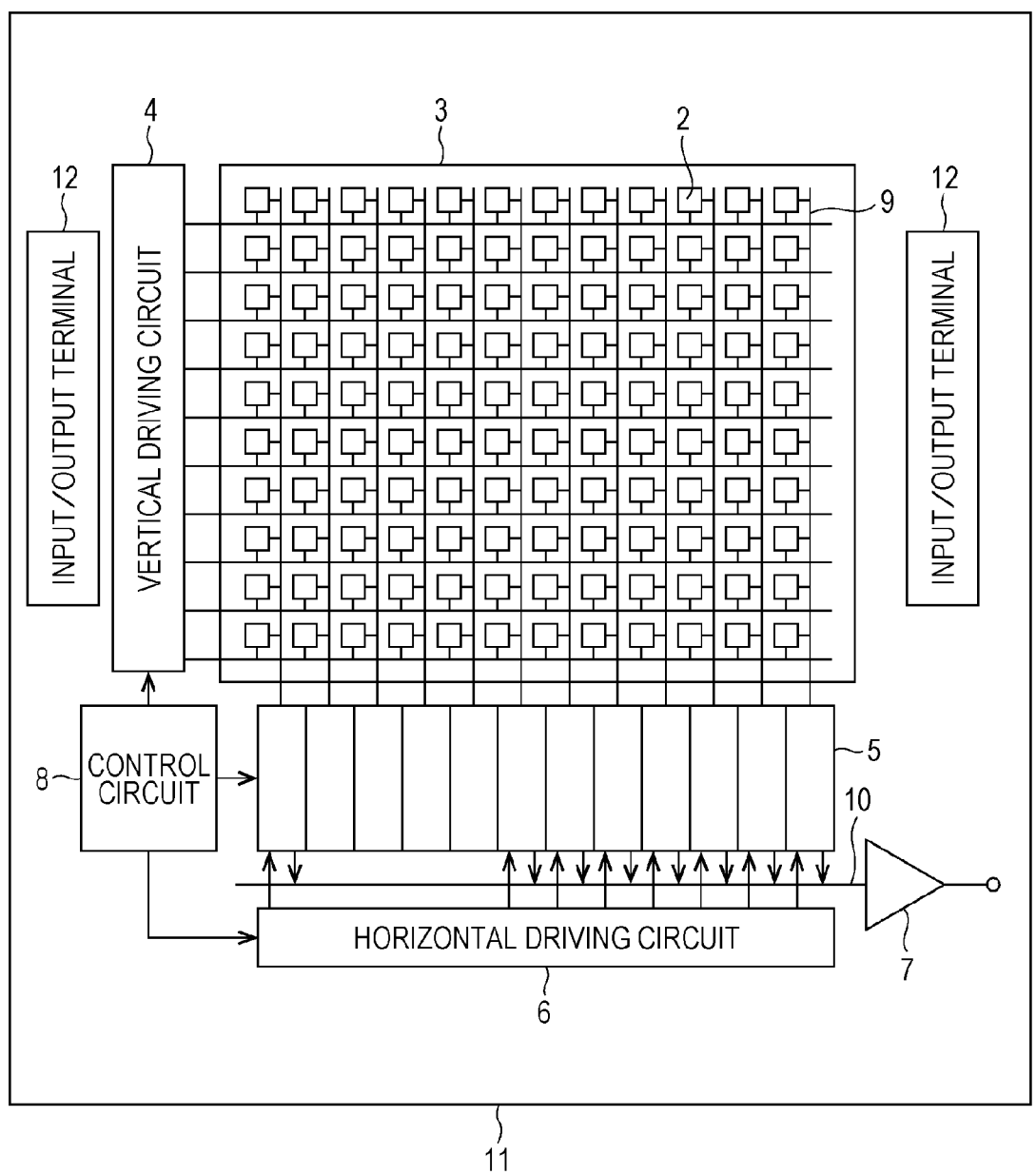
FIG. 2 is a diagram illustrating a schematic structure of a solid-state imaging device to which the present technique has been applied.

FIG. 2 is a diagram illustrating a schematic structure of the solid-state imaging device to which the present technique has been applied. A solid-state imaging device 1 is configured as a CMOS image sensor, for example.

The solid-state imaging device 1 of FIG. 2 includes a pixel region (so-called pixel array) 3 in which a plurality of pixels 2 each including a photoelectric conversion unit is regularly arranged in a two-dimensional array shape, and a peripheral circuit portion in a semiconductor substrate 11 such as a silicon substrate.

The pixel 2 includes a photoelectric conversion unit such as a photodiode, and a plurality of pixel transistors (so-called MOS transistors). The plurality of pixel transistors includes, for example, three transistors of a transfer transistor, a reset transistor, and an amplification transistor. Moreover, a selection transistor can be added and four transistors can be used as the pixel transistors. The pixels 2 can be configured as one unit pixel.

Moreover, the pixel 2 can have a common pixel structure. This pixel common structure is formed of a plurality of photodiodes, a plurality of transfer transistors, a common floating diffusion, and another common pixel transistor. In other words, in the common pixels, the photodiodes and the transfer transistors constituting the plurality of unit pixels are formed by sharing another pixel transistor.

The peripheral circuit portion includes a vertical driving circuit 4, a column signal processing circuit 5, a horizontal driving circuit 6, an output circuit 7, a control circuit 8, and the like.

The control circuit 8 receives an input clock and data ordering the operation mode or the like, and outputs the data such as the internal information of the solid-state imaging device.

In other words, on the basis of a vertical synchronization signal, a horizontal synchronization signal, and a master clock, the control circuit 8 generates a clock signal or a control signal based on which the vertical driving circuit 4, the column signal processing circuit 5, and the horizontal driving circuit 6 operate. These signals are input to the vertical driving circuit 4, the column signal processing circuit 5, and the horizontal driving circuit 6, etc.

The vertical driving circuit 4 is configured by a shift register, for example, selects the pixel driving line, and supplies pulses to drive the pixel to the selected pixel driving line, thereby driving the pixels in units of column. In other words, the vertical driving circuit 4 selectively scans the pixels 2 of the pixel region 3 in units of column sequentially in the vertical direction, and supplies the pixel signals based on the signal charges generated according to the amount of light received in the photoelectric conversion unit, such as the photodiode, in each pixel 2 through the vertical signal line 9 to the column signal processing circuit 5.

The column signal processing circuit 5 is provided for each column of the pixels 2, for example, and performs the signal processes such as noise removal for the signals output from one column of pixels 2 for each pixel column. In other words, the column signal processing circuit 5 performs the signal processes such as AD conversion, signal amplification, or CDS for removing the fixed pattern noise unique to the pixel 2. The output stage of the column signal processing circuit 5 is provided with a horizontal selection switch (not shown) in connection to the horizontal signal line 10.

The horizontal driving circuit 6 is formed of, for example, a shift register and selects each of the column signal processing circuits 5 in order by sequentially outputting the horizontal scan pulses, and outputs the pixel signal to the horizontal signal line 10 from each of the column signal processing circuits 5.

The output circuit 7 performs the signal process on the signals sequentially supplied through the horizontal signal line 10 from each of the column signal processing circuits 5 and then, outputs the signals. For example, the signals may be simply buffered, or the black level adjustment, the column variation correction, or other various digital signal processes may be performed. An input/output terminal 12 exchanges signals with the outside.

FIG. 3 illustrates a fundamental schematic structure of a solid-state imaging device according to an embodiment of the present technique.

A conventional solid-state imaging device 151 includes a pixel region 153, a control circuit 154, and a logic circuit 155 for signal processing mounted in one semiconductor chip 152 as illustrated in FIG. 3A. In general, an image sensor 156 is formed by the pixel region 153 and the control circuit 154.

On the other hand, in a solid-state imaging device according to an embodiment of the present technique, as illustrated in FIG. 3B, a pixel region 23 and a control region 24 are mounted on a first semiconductor chip portion 22 and a logic circuit 25 including a signal processing circuit for signal processing is mounted on a second semiconductor chip portion 26.

Alternatively, in the solid-state imaging device according to an embodiment of the present technique, as illustrated in FIG. 3C, the pixel region 23 is mounted on the first semiconductor chip portion 22 and the control region 24 and the logic circuit 25 including a signal processing circuit are mounted on the second semiconductor chip portion 26.

By electrically connecting the first and second semiconductor chip portions 22 and 26 to each other, the solid-state imaging device as one semiconductor chip is structured.

In other words, the solid-state imaging device according to the embodiment of the present technique is structured by stacking the semiconductor chips (semiconductor substrates).

Next, description is made of a manufacturing method for the solid-state imaging device formed by stacking the semiconductor substrates.

Figure 4:
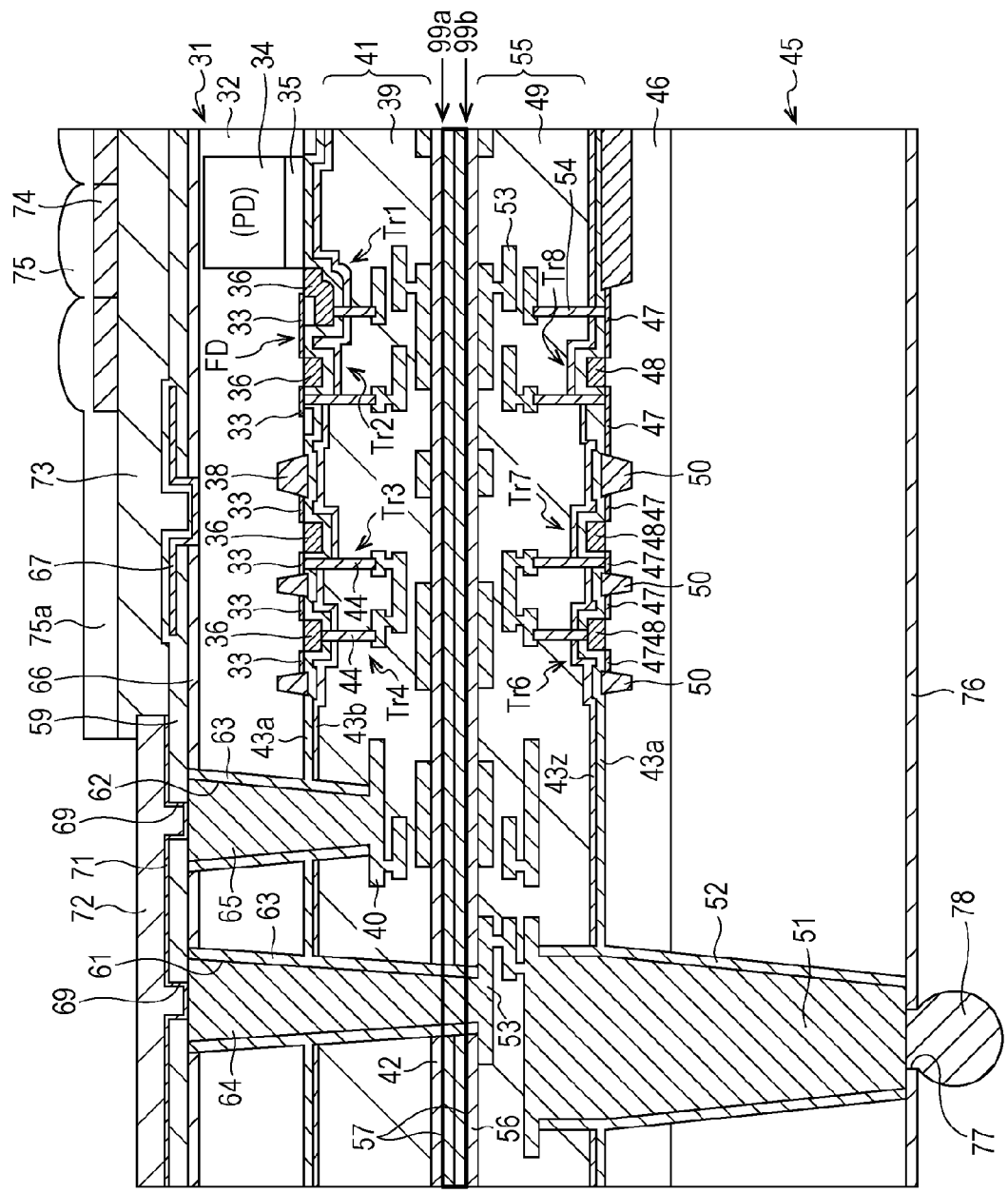
FIG. 4 is a sectional diagram illustrating a structure example according to an embodiment of a solid-state imaging device to which the present technique has been applied.

FIG. 4 is a sectional diagram illustrating a structure example according to an embodiment of the solid-state imaging device to which the present technique has been applied. This solid-state imaging device is formed as a rear surface irradiation type CMOS image sensor obtained by stacking a first semiconductor substrate and a second semiconductor substrate.

As illustrated in FIG. 4, the image sensor as a semi-finished product, i.e., the pixel array (hereinafter referred to as pixel region) 23 and the control region 24 are formed in each region of a first semiconductor substrate 31.

In other words, a photodiode (PD) serving as the photoelectric conversion unit of each pixel is formed in each region of the semiconductor substrate (for example, silicon substrate) 31, and a source/drain region 33 of each pixel transistor is formed in a semiconductor well region 32 thereof.

The semiconductor well region 32 is formed by introducing impurities of a first conductivity type, for example, p-type impurities, and the source/drain region 33 is formed by introducing impurities of a second conductivity type, for example, n-type impurities. The photodiode (PD) and the source/drain region 33 of each pixel transistor are formed by ion implantation from the substrate surface.

The photodiode (PD) is formed to have an n-type semiconductor region 34 and a p-type semiconductor region 35 on the substrate surface side.

On the substrate surface in the pixel, a gate electrode 36 is formed with a gate insulating film interposed therebetween, and a pixel transistor Tr1 and a pixel transistor Tr2 are formed by the source/drain region 33 that constitutes a pair with the gate electrode 36. Here, the plural pixel transistors are represented by two pixel transistors (Tr1 and Tr2).

The pixel transistor Tr1 adjacent to the photodiode (PD) corresponds to the transfer transistor, and the source/drain region thereof corresponds to the floating diffusion (FD).

Unit pixels 30 are separated by an element separation region 38. The element separation region 38 is formed by so-called LOCOS in which the semiconductor substrate 31 is oxidized to form a silicon oxide film, STI (Shallow Trench Isolation) in which a groove is formed in the semiconductor substrate 31 and the groove is filled with a silicon oxide film, or an impurity diffusion layer whose conductivity type is different from that of the diffusion layer serving as a node.

Figure 5:
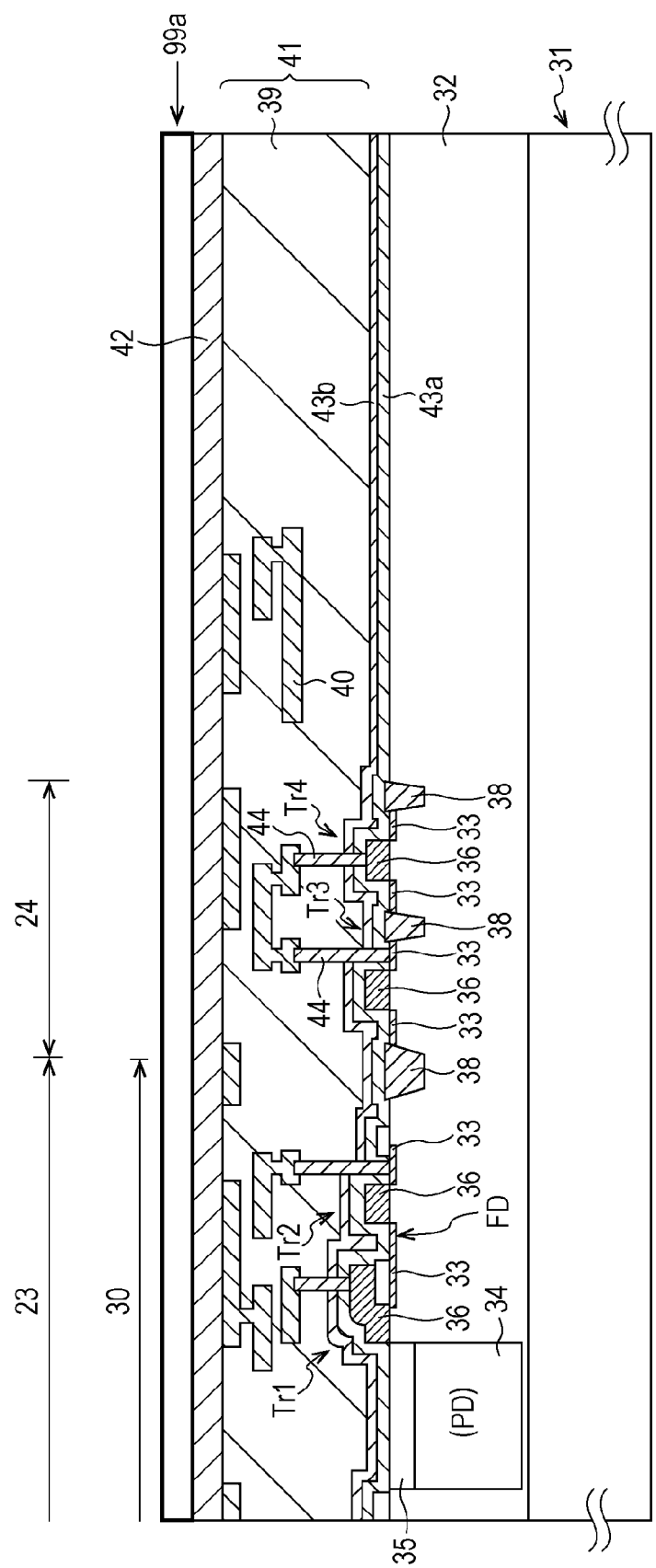
FIG. 5 is a diagram illustrating a manufacturing method for the solid-state imaging device of FIG. 4.

On the other hand, on the control region 24 side, a MOS transistor constituting the control circuit is formed in the semiconductor substrate 31. FIG. 5 illustrates the MOS transistors of the control region 24, which are represented by a MOS transistor Tr3 and a MOS transistor Tr4.

Each MOS transistor is formed by the n-type source/drain region 33, and the gate electrode 36 formed with a gate insulating film interposed therebetween.

Next, a first interlayer insulating film 39 is formed on a surface of the first semiconductor substrate 31, and then a connection hole is formed through the interlayer insulating film 39 and a connection conductor 44 to be connected to a predetermined transistor is formed.

For forming the connection conductor 44 with different height, a first insulating thin film 43a (for example, silicon oxide film) and a second insulating thin film 43b serving as an etching stopper in the etching for opening a contact hole (to be filled with the connection conductor 44) through which the connection with the gate electrode 36 or the source/drain region 33 is made are stacked on the entire surface including the upper surface of the transistor.

In this technique, a silicon nitride thin film is used as the second insulating thin film 43b and SiCN with a thickness of approximately 35 to 150 nm is used, for example. This enables the second insulating thin film 43b to serve also as a hydrogen supply film. In other words, the second insulating thin film 43b provided for the first semiconductor substrate 31 has higher hydrogen concentration than a second insulating thin film 43z to be described below.

On the second insulating thin film 43b, the first interlayer insulating film 39 is formed. Then, the connection hole with the different depth is formed in the first interlayer insulating film 39 selectively to reach the second insulating thin film 43b serving as the etching stopper. Next, the first insulating thin film 43a and the second insulating thin film 43b with the same thickness are selectively etched in each portion to form the connection holes to continue to the connection holes.

Then, the connection holes are filled with the connection conductor 44.

Next, a metal wire 40 with a plurality of layers (three layers in this example) is formed through the interlayer insulating film 39 so as to be connected to the connection conductors 44, thereby forming a multilayer wiring layer 41. The metal wire 40 is formed of a copper (Cu) wire. Each copper wire is generally coated with a barrier metal film that prevents the Cu diffusion. Therefore, a cap film for the copper wire 40, i.e., a protective film 42 is formed on the multilayer wiring layer 41.

Moreover, for example, a metal pad included in an extraction electrode used to input/output signals to/from the outside and the like are also coated with the barrier metal film as necessary.

Next, a diffusion prevention film 99a of atoms/molecules that are suitable for terminating the dangling bonds on the surface of the semiconductor, such as hydrogen, is formed on the protective film 42. For the diffusion prevention film 99a, for example, a SiN film formed with a thickness of 500 to 1500 μm by a plasma CVD method is used.

Here, 43b and 99a denote the silicon nitride thin film; however, by changing the manufacturing method, the hydrogen content in the thin films can be controlled. By changing the hydrogen content, a film containing a large amount of hydrogen can be used as a hydrogen supply film and a film containing a small amount of hydrogen can be used as a hydrogen diffusion prevention film.

Through these steps, the first semiconductor substrate 31 as the semi-finished product having the pixel region 23 and the control region 24 is formed.

Figure 6:
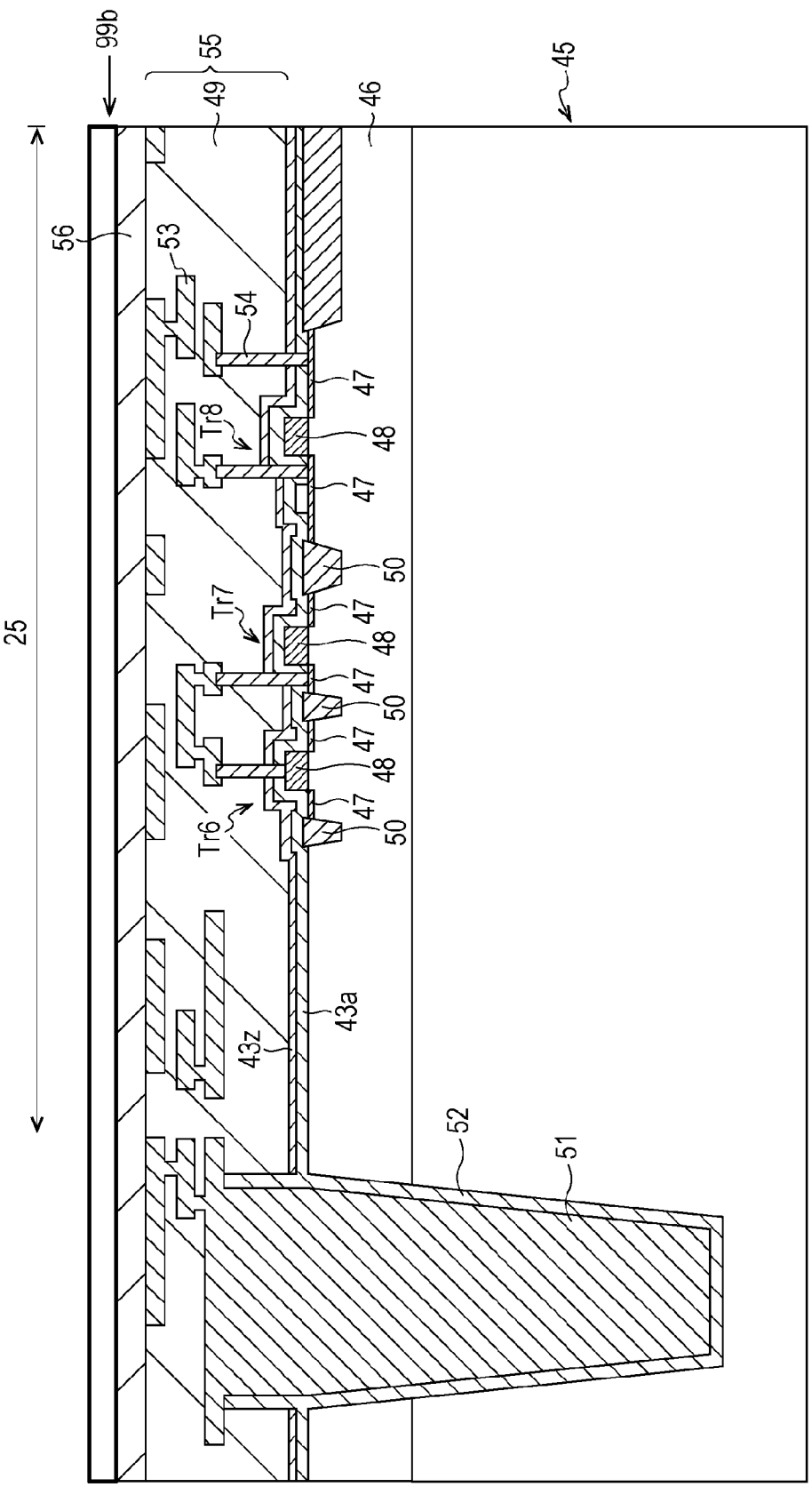
FIG. 6 is a diagram illustrating the manufacturing method for the solid-state imaging device of FIG. 4.

On the other hand, as illustrated in FIG. 6, the logic circuit 25 including a signal processing circuit for processing signals as the semi-finished product is formed in each region of a second semiconductor substrate (semiconductor chip) 45. In other words, a plurality of MOS transistors constituting the logic circuit is formed to be separated by an element separation region 50 in a p-type semiconductor well region 46 on the surface side of the semiconductor substrate (for example, silicon substrate) 45. Here, the plural MOS transistors are represented by a MOS transistor Tr6, a MOS transistor Tr7, and a MOS transistor Tr8.

The MOS transistor Tr6, the MOS transistor Tr7, and the MOS transistor Tr8 are each formed to have a pair of n-type source/drain regions 47, and a gate electrode 48 formed with a gate insulating film interposed therebetween. The logic circuit 25 can be formed by a CMOS transistor.

Next, a first interlayer insulating film 49 is formed on the surface of the second semiconductor substrate 45 and then a connection hole is formed through the interlayer insulating film 49, and a connection conductor 54 to be connected to a predetermined transistor is formed.

For forming the connection conductor 54 with the different height, the first insulating thin film 43a (for example, silicon oxide film) and the second insulating thin film 43z serving as the etching stopper are stacked on the entire surface including the upper surface of the transistor.

In the present technique, the second insulating thin film 43z provided for the second semiconductor substrate 45 is formed as a film with lower hydrogen concentration than the second insulating thin film 43b by being formed under a different film-formation condition from the second insulating thin film 43b.

The first interlayer insulating film 49 is formed on the second insulating thin film 43z. Then, the connection hole with the different depth is formed in the first interlayer insulating film 49 selectively to reach the second insulating thin film 43z serving as the etching stopper. Next, the first insulating thin film 43a and the second insulating thin film 43z with the same thickness are selectively etched in each portion to form the connection holes to continue to the connection holes. Then, the connection holes are filled with the connection conductor 54.

On the other hand, at a predetermined position in each region, the connection hole is formed at a desired depth in the semiconductor substrate 45 from the surface of the first interlayer insulating film 49 and the connection hole is filled with a connection conductor 51 for the extraction electrode. The connection conductor 51 can be formed of, for example, copper (Cu), tungsten (W), polysilicon, or the like.

Note that before the filling with the connection conductor 51, an insulating film 52 for insulating between the connection conductor 51 and the semiconductor substrate 45 is formed on the inner wall surface of the connection hole.

Next, a plurality of layers, three layers in this example, of metal wires 53 is formed through the interlayer insulating film 49 so as to connect to the connection conductor 51 for the electrode extraction and the connection conductor 54, thereby forming a multilayer wiring layer 55.

The metal wire 53 is formed of copper (Cu) wire. As described above, a cap film for the copper wire (metal wire) 53, i.e., a protective film 56 is formed on the multilayer wiring layer 55.

Next, a diffusion prevention film 99b for atoms/molecules that are suitable for terminating the dangling bonds on the surface of the semiconductor, such as hydrogen, is formed on the protective film 56. For the diffusion prevention film 99b, for example, a SiN film formed with a thickness of 300 to 1500 μm by plasma CVD is used.

Through these steps, the second semiconductor substrate 45 with the logic circuit 25 as the semi-finished product is formed.

Figure 7:
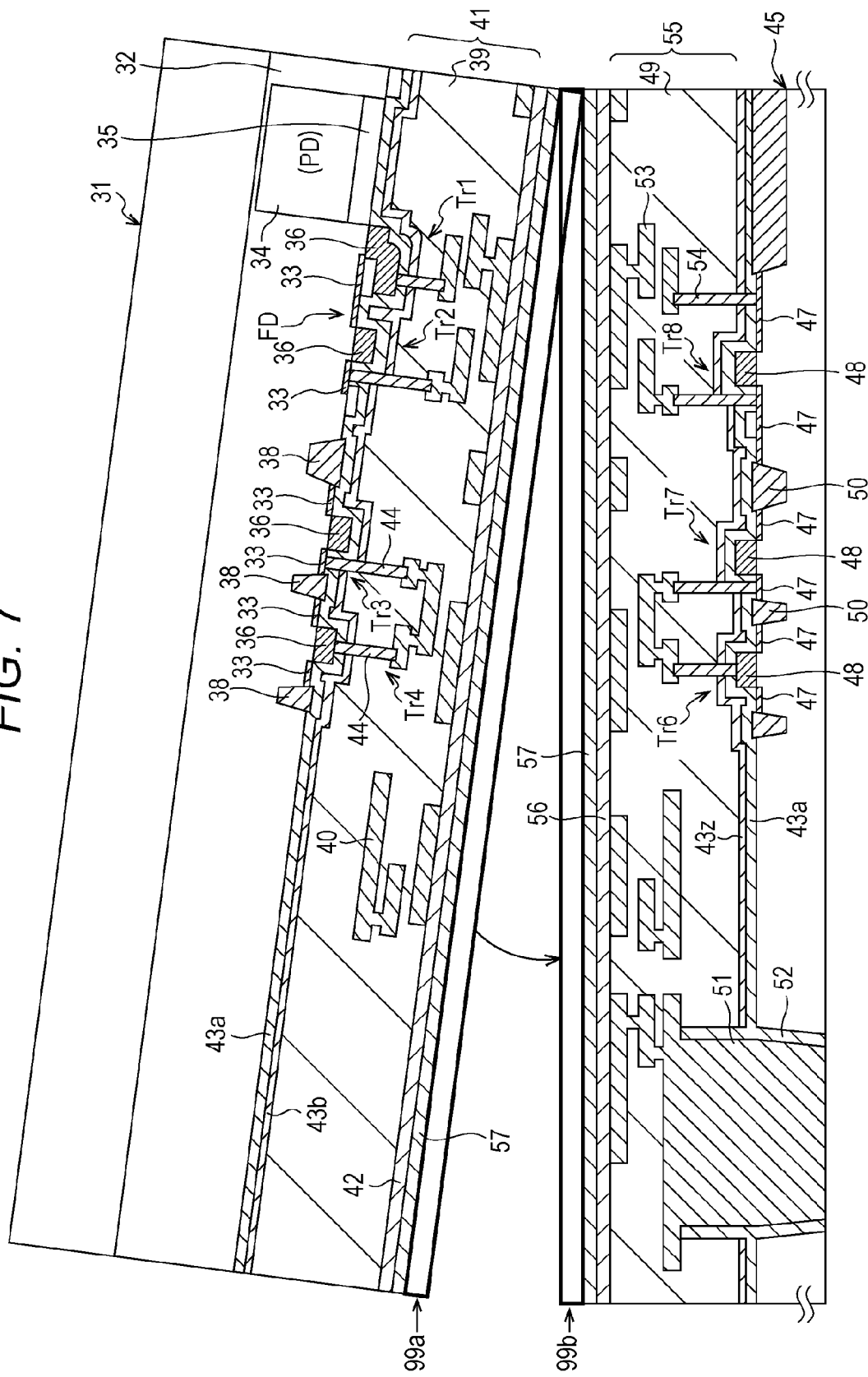
FIG. 7 is a diagram illustrating the manufacturing method for the solid-state imaging device of FIG. 4.

Next, as illustrated in FIG. 7, the first semiconductor substrate 31 and the second semiconductor substrate 45 are bonded to each other so that their multilayer wiring layers 41 and 55 face each other. The bonding may be, for example, plasma bonding or bonding with the adhesive.

In the case of the plasma bonding, a bonding plane of each of the first semiconductor substrate 31 and the second semiconductor substrate 45 is provided with, for example, a film 57 such as a plasma TEOS film, a SiN film, a SiON film (block film), a SiC film, or the like formed by plasma CVD. The bonding planes provided with the films 57 are overlapped on each other after the plasma treatment and then subjected to the annealing process, whereby the both are bonded to each other. The attaching process is preferably performed through a low-temperature process of 400° C. or less at which the wiring and the like are not affected.

By the heat treatment in the attaching process, hydrogen is supplied to the interface of the first semiconductor substrate 31 from the second insulating thin film 43b.

In the case of the bonding with the adhesive, one of the bonding planes of the first semiconductor substrate 31 and the second semiconductor substrate 45 is provided with an adhesive layer 58 and the substrates are bonded to each other with the adhesive layer 58 interposed therebetween.

The first semiconductor substrate 31 is thinned by grinding and polishing the first semiconductor substrate 31 from a rear surface 31b side. The thinning is performed so that the photodiode (PD) can be viewed. After the thinning, a p-type semiconductor layer is formed for suppressing the dark current on the rear surface of the photodiode (PD). The thickness of the semiconductor substrate 31 is, for example, approximately 600 μm and the semiconductor substrate 31 is thinned to have a thickness of, for example, 1 μm to 10 μm, preferably 1 μm to 5 μm.

After the thinning, an interlayer insulating film 59 is formed by a silicon oxide film or the like on the rear surface of the substrate. The rear surface 31b of the first semiconductor substrate 31 serves as a light incidence surface in the structure of the solid-state imaging device of a rear surface irradiation type.

At a predetermined position of the first semiconductor substrate 31 that has been thinned, a penetration connection hole 61 that reaches the uppermost wire 53 of the second semiconductor substrate 45 is formed through the first semiconductor substrate 31 from the rear surface 31b side. At the same time, the first semiconductor substrate 31 is provided with a connection hole 62 that is close to the penetration connection hole 61 and reaches a first wire 40 on the first semiconductor substrate 31 side from the rear surface 31b side.

The contact diameter of the penetration connection hole 61 or the connection hole 62 is approximately 1 to 5 μm. The penetration connection hole 61 and the connection hole 62 are formed after the first semiconductor substrate 31 is thinned; therefore, the aspect ratio is small and can be used as the micro-pore. The contact depth of the penetration connection hole 61 or the connection hole 62 can be set to, for example, approximately 5 μm to 15 μm. Next, the inner wall surface of the penetration connection hole 61 and the connection hole 62 is provided with an insulating film 63 for electrically insulating from the semiconductor substrate 31.

Next, the penetration connection hole 61 and the connection hole 62 are filled with a penetration connection conductor 64 and a connection conductor 65. For the penetration connection conductor 64 and the connection conductor 65, for example, metal such as copper (Cu) and tungsten (W) can be used.

After that, the entire surface of the rear surface of the first semiconductor substrate 31 is provided with an insulating protective film 66. As the insulating protective film 66, for example, a SiCN film, a plasma silicon nitride film, a SiC film or the like can be used.

Moreover, a light blocking film 67 is formed on a region to be shielded from light. As the light blocking film 67, for example, a metal film of tungsten can be used. By the electrical connection to the semiconductor well region 32 using this blocking film 67 as a ground potential, it is possible to prevent the light blocking film 67 from falling into the floating state. Moreover, by applying a ground potential to the light blocking film 67 electrically connected to the semiconductor well region 32, it is possible to prevent the semiconductor well region 32 from falling in the electrically floating state.

Moreover, the entire surface is provided with a passivation film 68 so as to cover the light blocking film 67. As the passivation film 68, for example, a plasma silicon nitride film, a CVD-SiV film or the like can be used.

Next, the penetration connection conductor 64 of the passivation film 68 and the insulating protective film 66 is formed and a connection hole 69 is formed in the portion corresponding to the connection conductor 65. After that, a connection wire 72 of an aluminum film is formed through a barrier metal film 71. The barrier metal film 71 is formed of a stack of layers of Ti (bottom)/TiN (top), for example.

The connection wire 72 is connected to the penetration connection conductor 64 and the connection conductor 65 through the connection hole 69. This connection wire 72 is used for the connection between the pixel region 23 and the control region 24, and the logic circuit 25 and also plays the role of the extraction electrode that extracts from the upper surface, i.e., the so-called electrode pad. The connection wire 72 is hereinafter referred to as an electrode pad.

Therefore, the image sensor including the pixel region 23 and the control region 24 provided for the first semiconductor substrate 31 is electrically connected to the logic circuit 25 provided for the second semiconductor substrate 45 through the connection conductor 65, the electrode pad 72, and the penetration connection conductor 64.

After that, a planarization film 73 is formed and on-chip color filters 74 of red (R), green (G), and blue (B) are formed for the pixels on the planarization film 73, and then an on-chip micro-lens 75 is formed thereon.

The on-chip color filters 74 and the on-chip micro-lens 75 are formed in units of pixels of the pixel array.

Next, a lens material film 75a and the planarization film 73 are selectively etched away to expose the electrode pad 72. On the other hand, on the second semiconductor substrate 45 side, the surface is ground and polished to expose the surface of the connection conductor 51 which is to serve as the extraction electrode.

After the passivation film 76 is formed on the exposed surface of the connection conductor 51 of the second semiconductor substrate 45, an opening 77 for the connection conductor 51 is formed and an electrode bump 78 with a spherical shape is formed in electrical connection to the connection conductor 51 through the opening 77.

Thus, in the first semiconductor substrate 31, the pixel region 23 and the control region 24 are provided as the finished product; in the second semiconductor substrate 45, the logic circuit 25 is provided as the finished product.

Next, the substrate is divided into chips to provide the solid-state imaging device of a rear surface irradiation type as illustrated in FIG. 4.

As illustrated in FIG. 4, in the solid-state imaging device to which the present technique has been applied, the diffusion prevention film 99a and the diffusion prevention film 99b are disposed at the bonding plane between the first semiconductor substrate 31 and the second semiconductor substrate 45. Thus, it is possible to prevent the hydrogen concentration from being uniformed in the first semiconductor substrate 31 and in the second semiconductor substrate 45 by suppressing the movement of hydrogen atoms/molecules between the stacked semiconductor substrates.

In the solid-state imaging device to which the present technique has been applied, the second insulating thin film 43b provided for the first semiconductor substrate 31 functions as the hydrogen supply film. Therefore, the hydrogen concentration can be increased in only the first semiconductor substrate 31 without the sinter process.

As a result, according to the present technique, the interface state can be reduced only in the semiconductor substrate having the pixel portion in the solid-state imaging device formed by stacking the semiconductor substrates.

Moreover, in recent years, for example, a method of directly bonding the metal wire of the first semiconductor substrate 31 and the metal wire of the second semiconductor substrate 45, a so-called Cu—Cu bonding method, may be employed in consideration of the thinning of the finished product.

Figure 8:
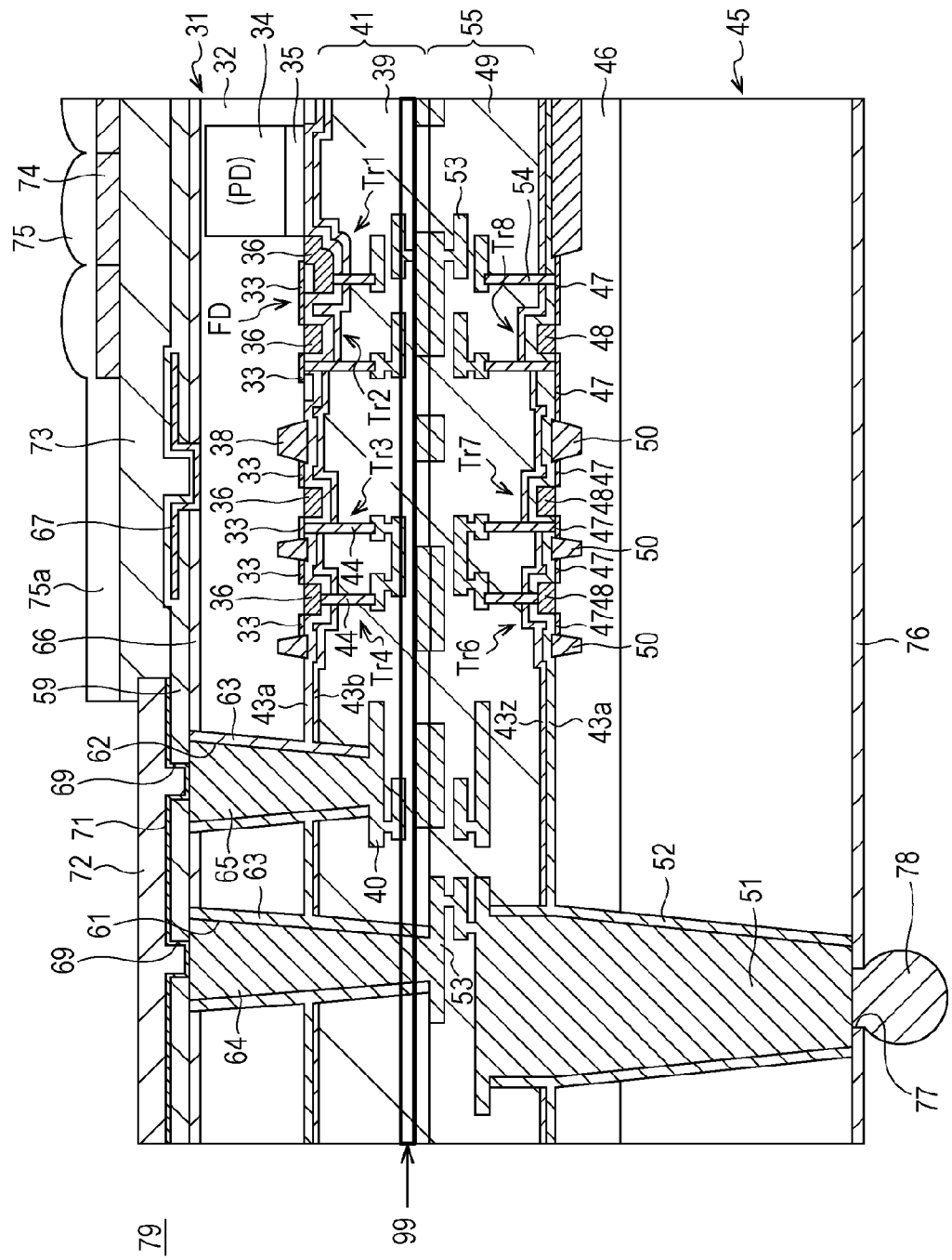
FIG. 8 is a sectional diagram illustrating a structure example according to another embodiment of the solid-state imaging device to which the present technique has been applied.

FIG. 8 illustrates a structure example according to another embodiment of the solid-state imaging device to which the present technique has been applied, which is formed by the Cu—Cu bonding. This solid-state imaging device is formed as a CMOS image sensor of a rear surface irradiation type formed by stacking the first semiconductor chip and the second semiconductor chip.

In the case of manufacturing the solid-state imaging device illustrated in FIG. 8, first, the image sensor as the semi-finished product, i.e., the pixel region 23 and the control region 24 are formed in each region of the first semiconductor substrate 31. Since this formation step is similar to that of the embodiment aforementioned with reference to FIGS. 4 to 7, the detailed description thereto is omitted.

In the case of the structure of FIG. 8, however, a multilayer wiring layer 41 is formed on the first semiconductor substrate 31 and the process is finished upon the formation of the wire 40 as the uppermost layer. In other words, the wire 40 as the uppermost layer is exposed and the protective film 42 illustrated in FIG. 5 is not formed thereon.

Moreover, before the formation of the wire 40 as the uppermost layer, for example, the diffusion prevention film 99 for the atoms/molecules that are suitable for the termination of the dangling bond on the surface of the semiconductor, such as hydrogen, is formed on the interlayer insulating film 39. As the diffusion prevention film 99, for example, a SiN film formed with a thickness of approximately 500 to 1500 μm by plasma CVD is used.

Moreover, the interlayer insulating film 39 is formed on the diffusion prevention film 99.

In each region of the second semiconductor substrate 45, the logic circuit 25 as the semi-finished product for the signal processing is formed. Since this formation step is also similar to that of the embodiment aforementioned with reference to FIGS. 4 to 7, the detailed description thereto is omitted.

In the case of the structure of FIG. 8, the multilayer wiring layer 55 is formed on the second semiconductor substrate 45; the process is finished upon the formation of the wire 53 as the uppermost layer. In other words, the wire 53 as the uppermost layer is exposed and the protective film 56 illustrated in FIG. 6 is not formed thereon.

The first semiconductor substrate 31 and the second semiconductor substrate 45 are bonded through their wires 40 and 53 so that the multilayer wiring layers 41 and 55 face each other, and are attached to each other by bonding their interlayer insulating films 39 and 49.

Here, the wires 40 and 53 are copper (Cu) wires, and the interlayer insulating films 39 and 49 are silicon oxide films.

Then, the semiconductor substrate 31 and the semiconductor substrate 45 are overlapped on each other so that their wires 40 and 53 are in direct contact with each other. After that, the wires 40 and 53 are directly bonded to each other by being heated while a predetermined weight is applied thereto. At the same time, the interlayer insulating films 39 and 49 are bonded to each other.

The heating temperature at the bonding is set to such a degree that the Cu wire is not damaged; for example, the temperature is set to approximately 200 to 400° C.

By the heat treatment at the bonding, hydrogen is supplied from the second insulating thin film 43b to the interface of the first semiconductor substrate 31.

As illustrated in FIG. 8, in the solid-state imaging device to which the present technique has been applied, the diffusion prevention film 99 is disposed below (upper side in the drawing) the wire 40 as the uppermost layer in the first semiconductor substrate 31. Thus, the movement of hydrogen atoms/molecules between the stacked semiconductor substrates can be prevented, whereby it is possible to prevent the hydrogen concentration from being uniformed in the first semiconductor substrate 31 and in the second semiconductor substrate 45.

Moreover, in the solid-state imaging device of FIG. 8, the second insulating thin film 43b provided for the first semiconductor substrate 31 functions as the hydrogen supply film. Therefore, the hydrogen concentration can be increased only in the first semiconductor substrate 31 without the sinter process.

As a result, in the solid-state imaging device formed by the Cu—Cu bonding in which the semiconductor substrates are stacked, the interface state can be reduced only in the semiconductor substrate having the pixel portion according to the present technique.

In the above description, the second insulating thin film 43b is used as the hydrogen supply film; however, another member may be used as the hydrogen supply film.

Figure 9:
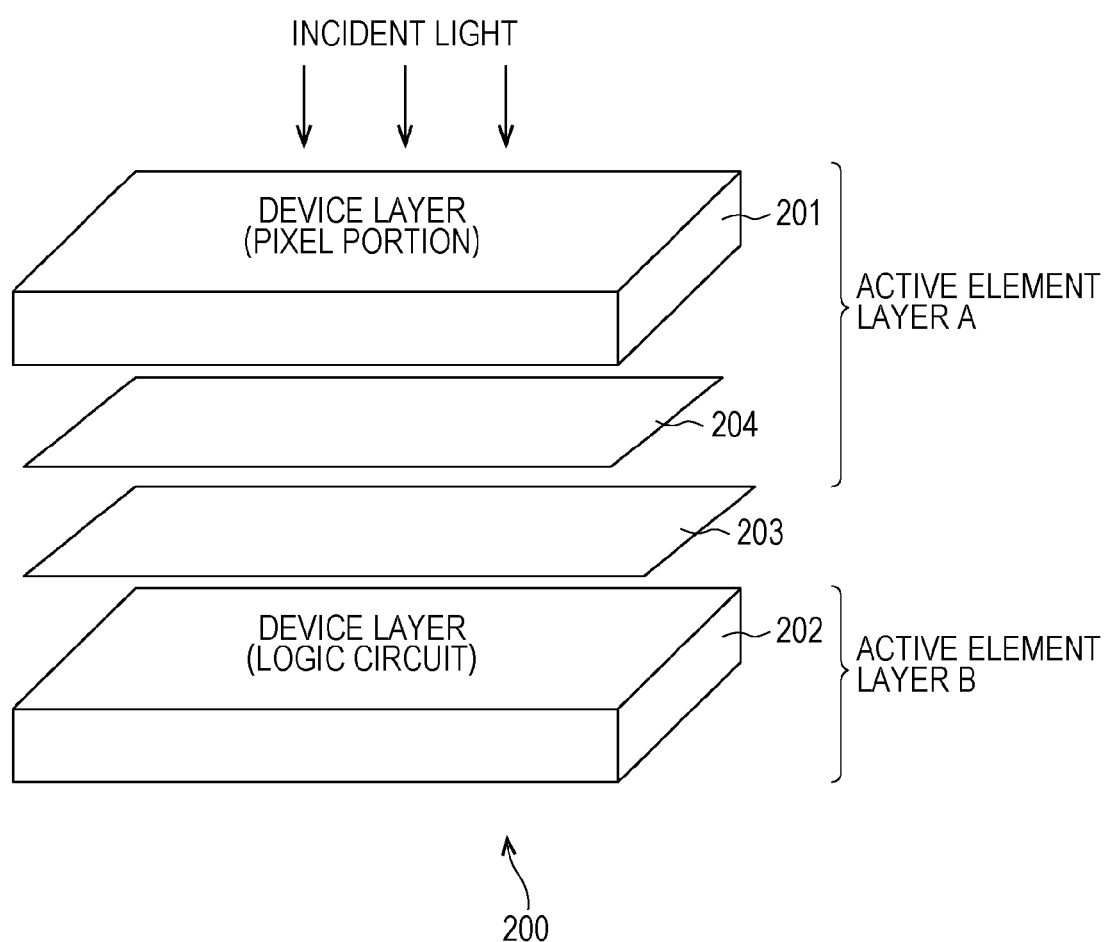
FIG. 9 is a diagram illustrating a simplified structure example of the solid-state imaging device to which the present technique has been applied.

FIG. 9 is a diagram illustrating a simplified structure example of the solid-state imaging device to which the present technique has been applied.

As illustrated in FIG. 9, a solid-state imaging device 200 to which the present technique has been applied is formed as a stacked type solid-state imaging device having two active element layers.

In other words, in FIG. 9, a device layer 201 is provided on the top of a solid-state imaging device 200, which serves as a light reception surface, and a device layer 202 is disposed on the bottom thereof, which is on the opposite side of the light reception surface. The device layer 201 corresponds to, for example, the first semiconductor substrate having the pixel portion and the device layer 202 corresponds to, for example, the second semiconductor substrate having the logic circuit.

In FIG. 9, a diffusion prevention film 203 is inserted between the device layer 201 and the device layer 202. The diffusion prevention film 203 is the film formed of the material suitable for preventing the diffusion of the material used for reducing the interface state (such as hydrogen).

In FIG. 9, the diffusion prevention film 203 is inserted between the first semiconductor substrate and the second semiconductor substrate; however, in fact, the diffusion prevention film 203 may be inserted between the interface of the first semiconductor substrate and the interface of the second semiconductor substrate. For example, as described above with reference to FIG. 8, the diffusion prevention film may be formed on the interlayer insulating film 39 before the wire 40 as the uppermost layer of the multilayer wiring layer 41 is formed on the first semiconductor substrate 31.

In FIG. 9, an atom supply film 204 is inserted between the diffusion prevention film 203 and the device layer 201. The atom supply film 204 is formed by, for example, the aforementioned second insulating thin film 43b and supplies hydrogen or the like as the dangling bond terminating atoms.

The second insulating thin film 43b is just an example of the atom supply film 204 and the atom supply film 204 may be formed by another member.

In other words, the active element layer A may be formed by the device layer 201 and the atom supply film 204 and the active element layer B may be formed by the device layer 202, and the diffusion prevention film 203 may be inserted between the active element layer A and the active element layer B.

With this structure, the interface state can be reduced only in the active element layer having the pixel portion.

Alternatively, a devise may be made so that the concentration of the dangling bond terminating atoms of the active element layer not having the pixel portion is reduced.

Figure 10:
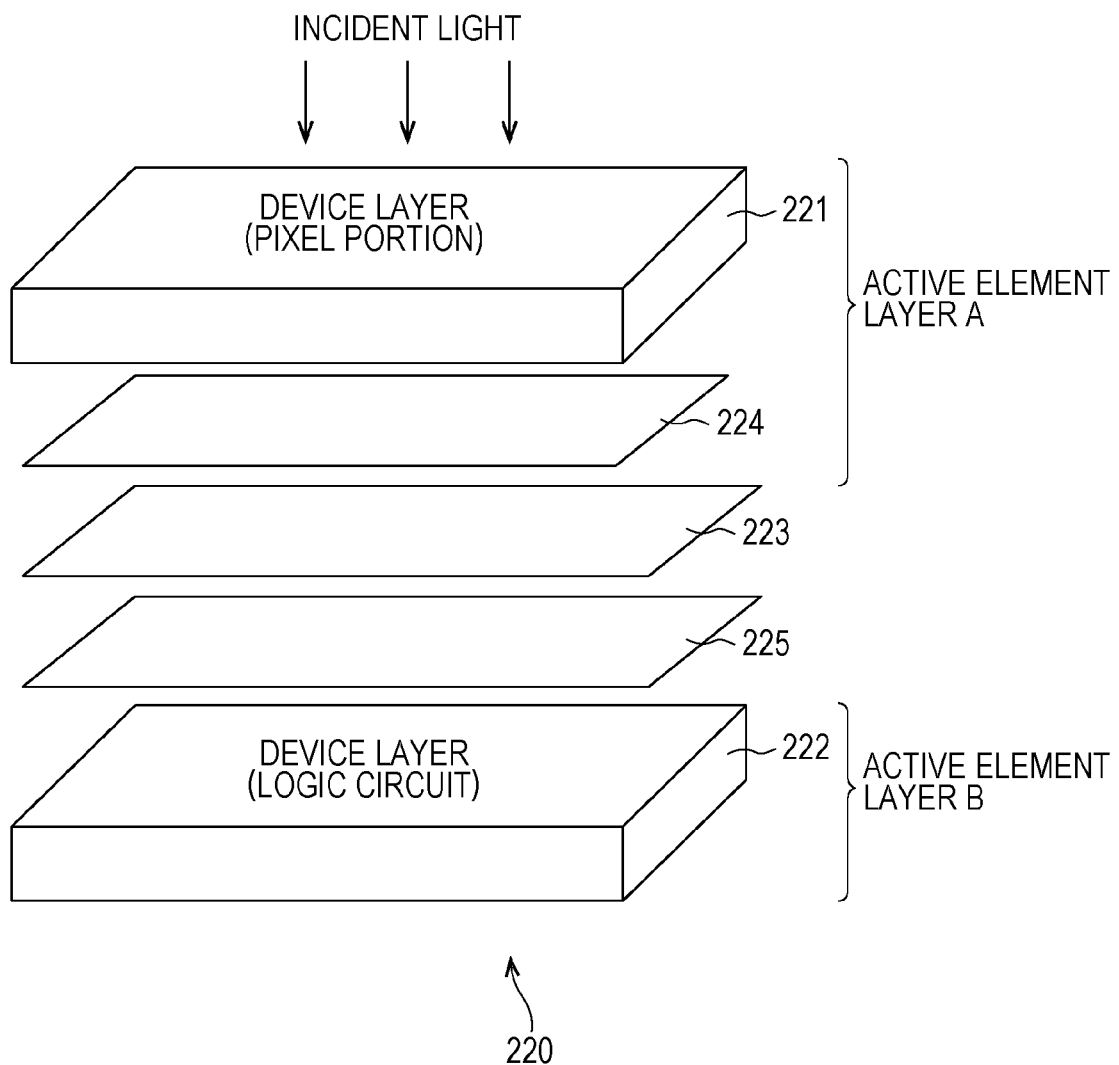
FIG. 10 is a diagram illustrating another simplified structure example of the solid-state imaging device to which the present technique has been applied.

FIG. 10 illustrates another simplified structure example of the solid-state imaging device to which the present technique has been applied.

As illustrated in FIG. 10, a solid-state imaging device 220 to which the present technique has been applied is formed as the stacked type solid-state imaging device having two active element layers.

In other words, in FIG. 10, a device layer 221 is disposed on the top of the solid-state imaging device 220, which serves as the light reception surface, and a device layer 222 is disposed on the bottom thereof, which is on the opposite side of the light reception surface. The device layer 221 corresponds to, for example, the first semiconductor substrate having the pixel portion and the device layer 222 corresponds to, for example, the second semiconductor substrate having the logic circuit.

In FIG. 10, a diffusion prevention film 223 is inserted between the device layer 221 and the device layer 222. The diffusion prevention film 223 is the film formed of the material suitable for preventing the diffusion of the material used for reducing the interface state (such as hydrogen).

In FIG. 10, the diffusion prevention film 223 is inserted between the first semiconductor substrate and the second semiconductor substrate; however, in fact, the diffusion prevention film 223 may be inserted between the interface of the first semiconductor substrate and the interface of the second semiconductor substrate. For example, as described above with reference to FIG. 8, the diffusion prevention film may be formed on the interlayer insulating film 39 before the wire 40 as the uppermost layer of the multilayer wiring layer 41 is formed on the first semiconductor substrate 31.

In FIG. 10, an atom supply film 224 is inserted between the diffusion prevention film 223 and the device layer 221. The atom supply film 224 is formed by, for example, the aforementioned second insulating thin film 43b and supplies hydrogen or the like as the dangling bond terminating atoms.

Moreover, in FIG. 10, an atom occlusion film 225 is inserted between the diffusion prevention film 223 and the device layer 221. The atom occlusion film 225 is formed of a material suitable for occluding the dangling bond terminating atom (such as hydrogen). For example, the barrier metal covering the metal wire 53 illustrated in FIG. 6 can be used as the atom occlusion film 225.

In other words, as described above with reference to FIG. 6, the multilayer wiring layer 55 is formed by forming the metal wire 53 with a plurality of layers through the interlayer insulating film 49 so as to be connected to the connection conductors 54 and the connection conductors 51 for the electrode extraction.

The metal wire 53 is formed of the copper (Cu) wire. On this occasion, the copper wires are formed to be covered with the barrier metal that prevents the Cu diffusion. For example, if hydrogen is used as the dangling bond terminating atoms, titanium or the like that is suitable for the hydrogen occlusion is used as the barrier metal.

Then, the cap film for the copper wire 53, i.e., the protective film 56 is formed on the multilayer wiring layer 55.

Thus, the atom occlusion film 225 illustrated in FIG. 10 can be formed by the barrier metal covering the metal wire of the second semiconductor substrate.

Note that the barrier metal is just an example of the atom occlusion film 225 and the atom occlusion film 225 may be formed by another member.

In other words, the active element layer A may be formed by the device layer 221 and the atom supply film 224 and the active element layer B may be formed by the device layer 222, and then the diffusion prevention film 223 and the atom occlusion film 225 may be inserted between the active element layer A and the active element layer B.

With such a structure, the interface state can be reduced in only the active element layer having the pixel portion and moreover the concentration of the dangling bond terminating atoms can be reduced in the active element layer not having the pixel portion.

Description has been made of the example in which the present technique is applied to the stacked type solid-state imaging device having the two active element layers; however, the present technique can be applied to a stacked type solid-state imaging device having three active element layers.

Figure 11:
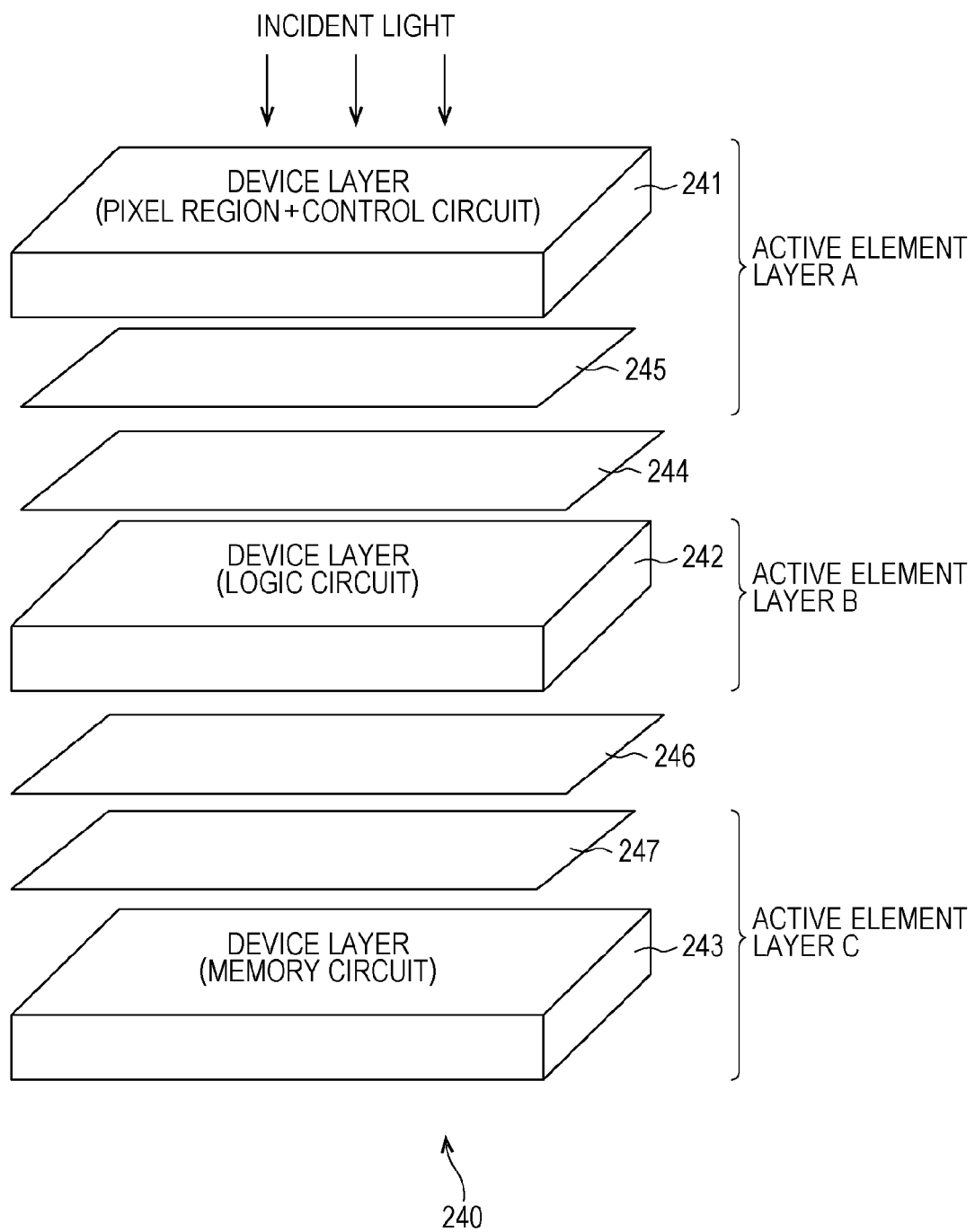
FIG. 11 is a diagram illustrating another simplified structure example of the solid-state imaging device to which the present technique has been applied.

FIG. 11 is a diagram illustrating another simplified structure example of the solid-state imaging device to which the present technique has been applied.

As illustrated in FIG. 11, a solid-state imaging device 240 to which the present technique has been applied is formed as the stacked type solid-state imaging device having three active element layers.

In other words, in FIG. 11, a device layer 241 is provided on the top of the solid-state imaging device 240, which serves as the light reception surface, and a device layer 243 is provided on the bottom, which is on the opposite side of the light reception surface, and a device layer 242 is disposed between the device layer 241 and the device layer 243. The device layer 241 corresponds to, for example, the first semiconductor substrate having the pixel portion, the device layer 242 corresponds to, for example, the second semiconductor substrate having the logic circuit, and the device layer 243 corresponds to, for example, a third semiconductor substrate having a memory circuit.

Note that the third semiconductor substrate of the device layer 243 is manufactured in a manner similar to the first semiconductor substrate or the second semiconductor substrate, and has the function of the memory circuit such as a DRAM or an SRAM patterned instead of the function of the pixel portion or the logic circuit.

In regard to the memory circuit, it has been known that the memory characteristic such as the retention characteristic in the DRAM would deteriorate if the flicker noise or the RTN (Random Telegraph Noise) occurred due to the increase in the interface state of the third semiconductor substrate.

In other words, in the solid-state imaging device 240, it is desirable that the interface state of the device layer 243 is decreased in a manner similar to the device layer 241.

In FIG. 11, a diffusion prevention film 244 is inserted between the device layer 241 and the device layer 242. The diffusion prevention film 244 is the film formed of the material suitable for preventing the diffusion of the material used for reducing the interface state (such as hydrogen).

In FIG. 11, the diffusion prevention film 244 is inserted between the first semiconductor substrate and the second semiconductor substrate; however, in fact, the diffusion prevention film 244 may be inserted between the interface of the first semiconductor substrate and the interface of the second semiconductor substrate.

In FIG. 11, an atom supply film 245 is inserted between the diffusion prevention film 244 and the device layer 241. The atom supply film 245 supplies hydrogen or the like as the dangling bond terminating atoms.

Moreover, in FIG. 11, a diffusion prevention film 246 is inserted between the device layer 242 and the device layer 243. The diffusion prevention film 246 is the film formed of the material suitable for preventing the diffusion of the material used for reducing the interface state (such as hydrogen).

In FIG. 11, the diffusion prevention film 246 is inserted between the second semiconductor substrate and the third semiconductor substrate; however, in fact, the diffusion prevention film 246 may be inserted between the interface of the second semiconductor substrate and the interface of the third semiconductor substrate.

In FIG. 11, an atom supply film 247 is inserted between the diffusion prevention film 246 and the device layer 243. The atom supply film 245 supplies hydrogen or the like as the dangling bond terminating atoms.

In other words, the active element layer A may be formed by the device layer 241 and the atom supply film 245, the active element layer B may be formed by the device layer 242, the active element layer C may be formed by the device layer 243 and the atom supply film 247, the diffusion prevention film 244 may be inserted between the active element layer A and the active element layer B, and the diffusion prevention film 246 may be inserted between the active element layer B and the active element layer C.

By the above structure, the interface state can be reduced in only the active element layer having the pixel portion and the active element layer having the memory circuit.

Alternatively, the solid-state imaging device may be formed without the provision of the atom supply film.

Figure 12:
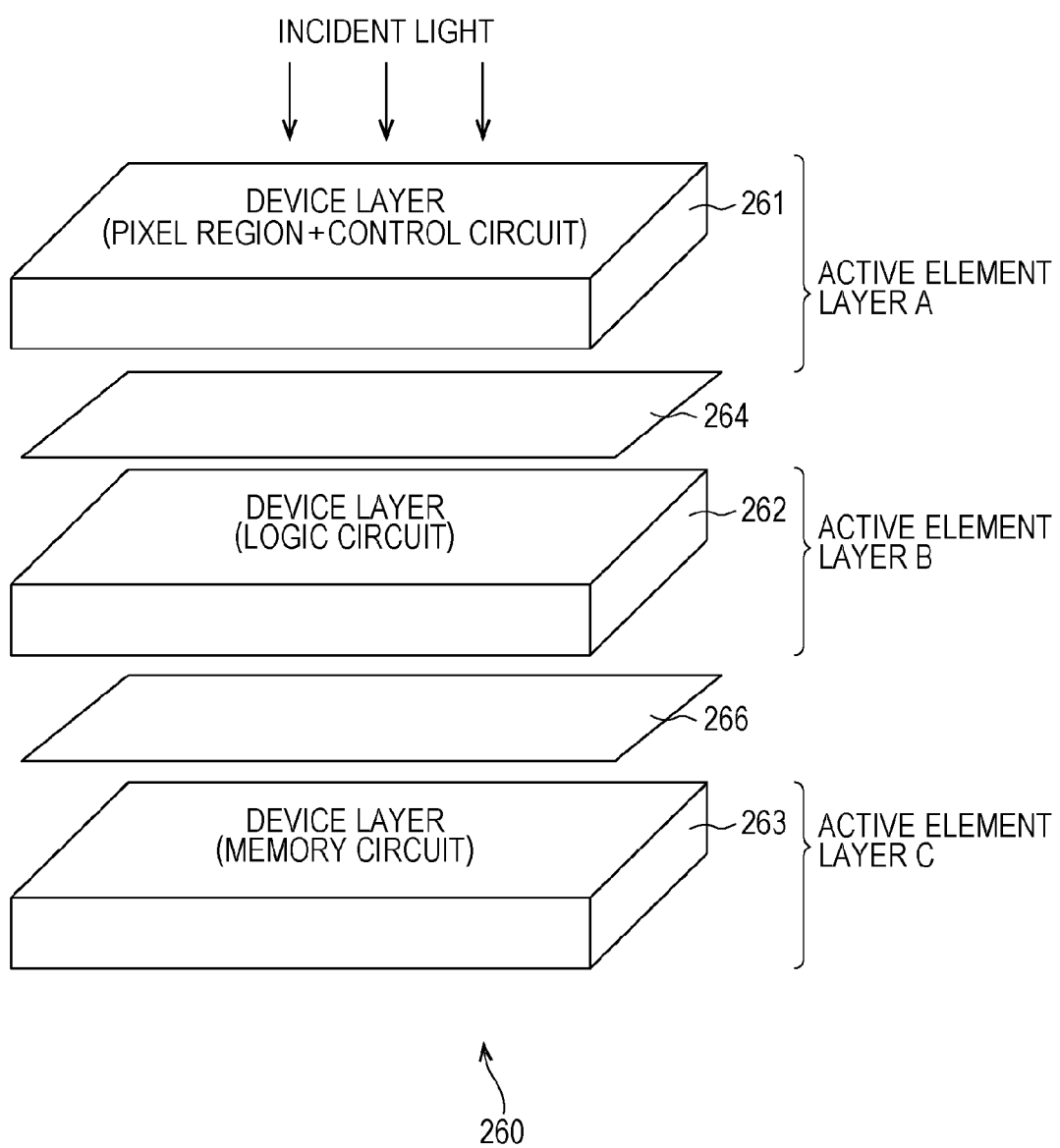
FIG. 12 is a diagram illustrating another simplified structure example of the solid-state imaging device to which the present technique has been applied.

FIG. 12 is a diagram illustrating another simplified structure example of the solid-state imaging device to which the present technique has been applied.

As illustrated in FIG. 12, a solid-state imaging device 260 to which the present technique has been applied is formed as a stacked type solid-state imaging device having three active element layers.

In other words, in FIG. 12, a device layer 261 is disposed on the top of the solid-state imaging device 260, which serves as the light reception surface, a device layer 263 is disposed on the bottom, which is on the opposite side of the light reception surface, and a device layer 262 is disposed between the device layer 261 and the device layer 263. The device layer 261 corresponds to, for example, the first semiconductor substrate having the pixel portion, the device layer 262 corresponds to, for example, the second semiconductor substrate having the logic circuit, and the device layer 263 corresponds to, for example, the third semiconductor substrate having the memory circuit.

The third semiconductor substrate of the device layer 263 is manufactured in a manner similar to the first semiconductor substrate or the second semiconductor substrate, and has the function of the memory circuit such as a DRAM or an SRAM patterned instead of the function of the pixel portion or the logic circuit.

It has been known that, in the memory circuit, the memory characteristic such as the retention characteristic in the DRAM would deteriorate if the flicker noise or RTN (Random Telegraph Noise) or the like occurred due to the increase in interface state of the third semiconductor substrate.

In other words, in the solid-state imaging device 260, it is desirable that the interface state of the device layer 263 is decreased in a manner similar to the device layer 261.

In FIG. 12, a diffusion prevention film 264 is inserted between the device layer 261 and the device layer 262. The diffusion prevention film 264 is the film formed of the material suitable for preventing the diffusion of the material used for reducing the interface state (such as hydrogen).

In FIG. 12, the diffusion prevention film 264 is inserted between the first semiconductor substrate and the second semiconductor substrate; however, in fact, the diffusion prevention film 264 may be inserted between the interface of the first semiconductor substrate and the interface of the second semiconductor substrate.

In the structure of FIG. 12, the atom supply film is not inserted between the diffusion prevention film 264 and the device layer 261.

Moreover, in FIG. 12, a diffusion prevention film 266 is inserted between the device layer 262 and the device layer 263. The diffusion prevention film 266 is the film formed of the material suitable for preventing the diffusion of the material used for reducing the interface state (such as hydrogen).

In FIG. 12, the diffusion prevention film 266 is inserted between the second semiconductor substrate and the third semiconductor substrate; however, in fact, the diffusion prevention film 266 may be inserted between the interface of the second semiconductor substrate and the interface of the third semiconductor substrate.

In the structure of FIG. 12, the atom supply film is not inserted between the diffusion prevention film 266 and the device layer 263.

In other words, the active element layer A may be formed by the device layer 261, the active element layer B may be formed by the device layer 262, the active element layer C may be formed by the device layer 263, the diffusion prevention film 264 may be inserted between the active element layer A and the active element layer B, and the diffusion prevention film 266 may be inserted between the active element layer B and the active element layer C.

Then, for example, after the device layer 261, the device layer 262, and the device layer 263 are bonded to each other, the hydrogen sinter process is performed at approximately 200 to 400° C., whereby the interface state of the device layer 261 and the device layer 263 is decreased. On this occasion, hydrogen hardly enters the device layer 262 held between the diffusion prevention film 264 and the diffusion prevention film 266.

With the structure as above, the interface state can be reduced in only the active element layer having the pixel portion and the active element layer having the memory circuit.

Note that the atom supply film may be omitted in the stacked type solid-state imaging device having the two active element layers. For example, in the solid-state imaging device 200 illustrated in FIG. 9, the atom supply film 204 may be omitted.

Although description has been made of the example in which the present technique is applied to the solid-state imaging device, the present technique can be applied to other devices than the solid-state imaging device. For example, the present technique can be applied to a bipolar device such as a wireless transceiver.

Figure 13:
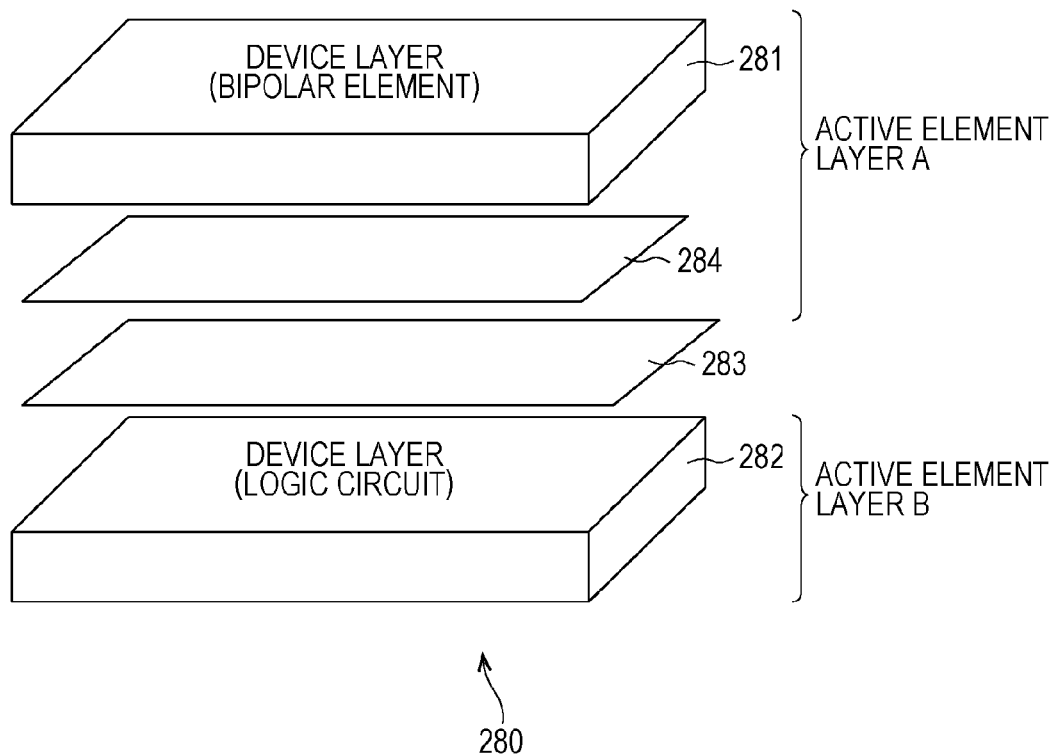
FIG. 13 is a diagram illustrating a simplified structure example of a bipolar device to which the present technique has been applied.

FIG. 13 is a diagram illustrating a simplified structure example of the bipolar device to which the present technique has been applied.

As illustrated in FIG. 13, a bipolar device 280 to which the present technique has been applied is structured as a stacked type wireless transceiver having two active element layers.

In FIG. 13, a device layer 281 is disposed on the top of the bipolar device 280 and a device layer 282 is disposed on the bottom thereof. The device layer 281 corresponds to, for example, the first semiconductor substrate having the bipolar element, and the device layer 282 corresponds to, for example, the second semiconductor substrate having the logic circuit.

In the bipolar device 280, it is desirable that the interface state is reduced only in the device layer 281.

In FIG. 13, a diffusion prevention film 283 is inserted between the device layer 281 and the device layer 282. The diffusion prevention film 283 is the film formed of the material suitable for preventing the diffusion of the material used for reducing the interface state (such as hydrogen).

In FIG. 13, the diffusion prevention film 283 is inserted between the first semiconductor substrate and the second semiconductor substrate; however, in fact, the diffusion prevention film 283 may be inserted between the interface of the first semiconductor substrate and the interface of the second semiconductor substrate.

In FIG. 13, an atom supply film 284 is inserted between the diffusion prevention film 283 and the device layer 281. The atom supply film 284 supplies hydrogen or the like as the dangling bond terminating atom.

In other words, the active element layer A may be formed by the device layer 281 and the atom supply film 284, the active element layer B may be formed by the device layer 282, and the diffusion prevention film 283 may be inserted between the active element layer A and the active element layer B.

With the structure as above, the interface state can be reduced in only the active element layer having the bipolar element.

Incidentally, the above embodiment has described the case in which the diffusion prevention film is a SiN film formed by plasma CVD (the film is referred to as P-SiN film). It has been known that, however, the SiN film formed by LP-CVD (referred to as LP-SiN) is more effective in preventing the diffusion of hydrogen than the P-SiN film.

The diffusion prevention film formed of LP-SiN has high film density, which is approximately 2.7 g/cm to 3.5 g/cm.

The interface state can be reduced in only the active element layer having the pixel portion if the LP-SiN film can be used as the diffusion prevention film, in which case the effect of the present technique that the concentration of the dangling bond terminating atoms of the active element layer not having the pixel portion is decreased can be enhanced.

However, in the LP-CVD, the film formation process is performed at higher temperature than in the plasma CVD. For example, the film formation process is performed at approximately 400° C. in the plasma CVD while the film formation process is formed at high temperature of more than 600° C. in the LP-CVD.

The film formation process at the high temperature of more than 600° C. affects the metal wire formed as the copper thin film on the semiconductor substrate. In other words, it is concerned that copper diffuses due to the high temperature to deteriorate the device characteristic.

In the above embodiment, the multilayer wiring layer 41 is formed by forming the metal wire 40 with a plurality of layers through the interlayer insulating film 39, the protective film 42 is formed on the multilayer wiring layer 41, and then the diffusion prevention film 99a is formed on the protective film 42. The diffusion prevention film is desirably formed after the metal wire is formed. If the metal wire is formed after the diffusion prevention film is formed, it is necessary to form the holes for the wires in the diffusion prevention film, in which case hydrogen diffuses through these holes.

On the other hand, since the film formation process is performed at high temperature in the LP-CVD, the diffusion prevention film cannot be formed after the step (BEOL: Back End Of Line) of forming the metal wire.

In view of this, in the present technique, the solid-state imaging device is manufactured through the process as below if the diffusion prevention film is LP-SiN. FIGS. 14 to 17 are drawings to describe the process of manufacturing the solid-state imaging device in the case of using LP-SiN as the diffusion prevention film. This solid-state imaging device is formed by stacking semiconductor substrates.

Figure 14:
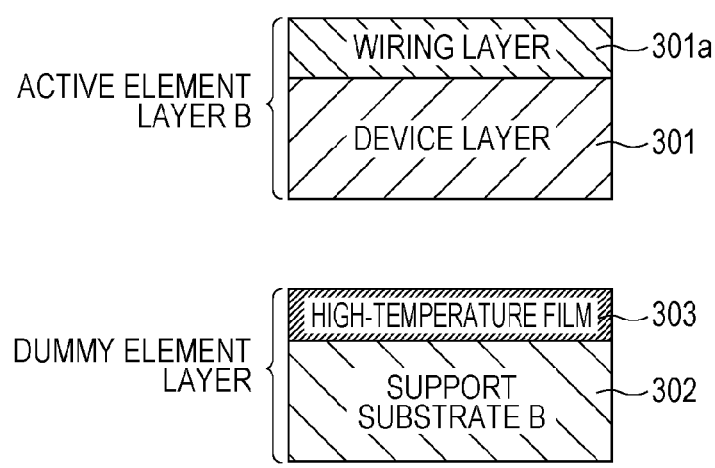
FIG. 14 is a diagram illustrating a manufacturing process for a solid-state imaging device when LP-SiN is used as the diffusion prevention film.

First, as illustrated in FIG. 14, a device layer 301, which corresponds to a semiconductor substrate constituting the active element layer B, is manufactured. The device layer 301 is already provided with a wiring layer 301*a* having a metal wire. Note that the wiring layer 301*a* corresponds to, for example, the multilayer wiring layer 55 of FIG. 6.

On the other hand, a high-temperature film 303 is formed on a support substrate 302. Here, the high-temperature film corresponds to a diffusion prevention film formed of LP-SiN, and the support substrate 302 corresponds to, for example, a plate-shaped silicon not including the metal wire and the like. As described above, the diffusion prevention film formed of LP-SiN is formed by the film formation process at the high temperature by LP-CVD and the film formation at the high temperature does not cause any problem because the support substrate 302 does not include the metal wire and the like.

The support substrate 302 provided with the high-temperature film 303 is referred to as a dummy element layer.

Figure 15:
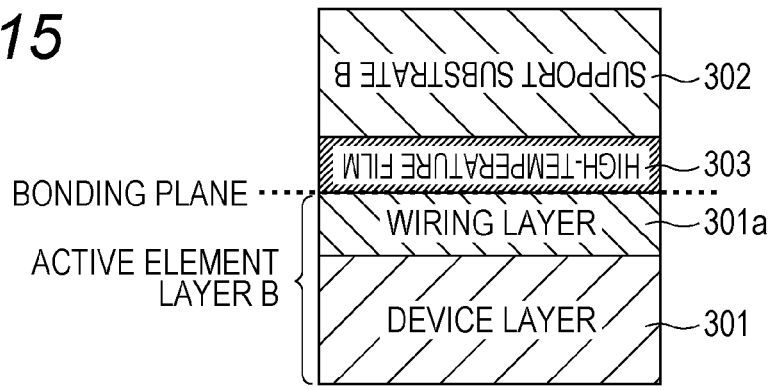
FIG. 15 is a diagram illustrating the manufacturing process for a solid-state imaging device when LP-SiN is used as the diffusion prevention film.

Next, as illustrated in FIG. 15, the active element layer B and the dummy element layer are bonded to each other. The bonding is conducted by the aforementioned plasma bonding or bonding with an adhesive, for example. In the case of the plasma bonding, the low-temperature process of 400° C. or less, at which the wires and the like are not affected, is performed. In FIG. 15, the active element layer B and the dummy element layer are bonded to each other so that the plane between the wiring layer 301*a* and the high-temperature film 303 serves as the bonding plane.

Figure 16:
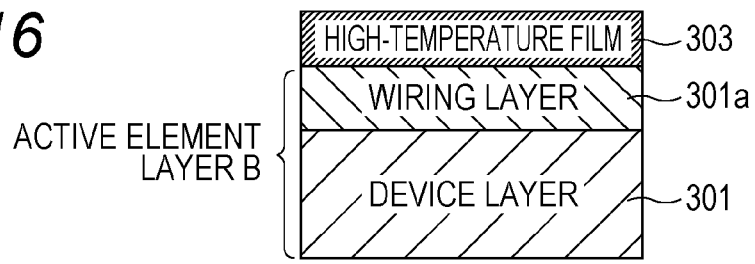
FIG. 16 is a diagram illustrating the manufacturing process for a solid-state imaging device when LP-SiN is used as the diffusion prevention film.

After that, the support substrate 302 is polished to be removed. Thus, as illustrated in FIG. 16, the high-temperature film 303 is formed on the active element layer B.

Figure 17:
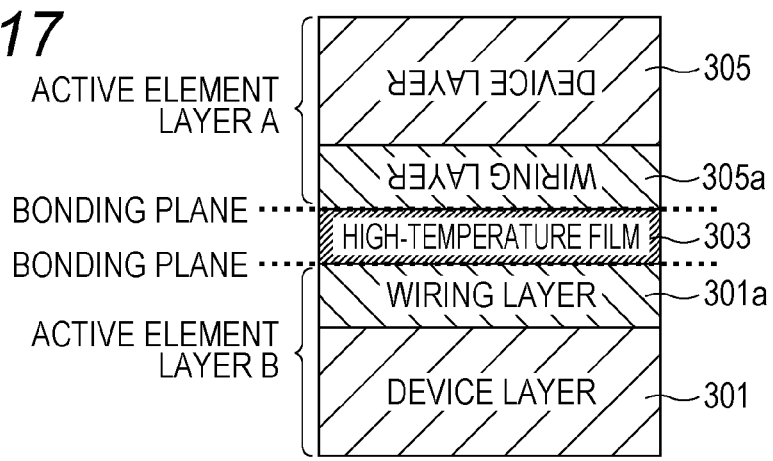
FIG. 17 is a diagram illustrating the manufacturing process for a solid-state imaging device when LP-SiN is used as the diffusion prevention film.

Then, as illustrated in FIG. 17, the active element layer A is bonded onto the high-temperature film 303. The active element layer A is formed by a device layer 305 as the semiconductor substrate, and the device layer 305 is already provided with a wiring layer 305*a* having the metal wire. Note that the wiring layer 305*a* corresponds to the multilayer wiring layer 41 of FIG. 5, for example.

The bonding in FIG. 17 is also conducted by the plasma bonding or the bonding with the adhesive. In the case of the plasma bonding, the low-temperature process at 400° C. or less at which the wire and the like are not affected is performed. In FIG. 17, the active element layer A and the high-temperature film 303 are bonded to each other so that the plane between the wiring layer 305*a* and the high-temperature film 303 serves as the bonding plane.

Although not illustrated here, the atom supply film is inserted between the high-temperature film 303 and the device layer 301 (or the device layer 305).

Thus, LP-SiN can be used as the diffusion prevention film without affecting the metal wire. Accordingly, the interface state can be reduced in only the active element layer having the pixel portion and the effect of the present technique that the concentration of the dangling bond terminating atoms of the active element layer not having the pixel portion is decreased can be enhanced.

In the case of using P-SiN as the diffusion prevention film, a film thickness of approximately 500 to 1500 nm is necessary for providing the diffusion prevention capability; however, the large thickness of the diffusion prevention film makes it difficult to form the penetration connection hole. In the case of using LP-SiN as the diffusion prevention film, a film thickness of approximately 20 to 150 nm is enough to provide the diffusion prevention capability; thus, the penetration connection hole can be formed easily and the yield of the solid-state imaging device is improved.

Although the example of FIG. 17 has described the structure of the solid-state imaging device formed by stacking the semiconductor substrates, in which the active element layer A and the active element layer B have their wiring layers facing each other with the high-temperature film 303 as the diffusion prevention film interposed therebetween, the semiconductor substrates may be stacked in another mode.

Figure 18:
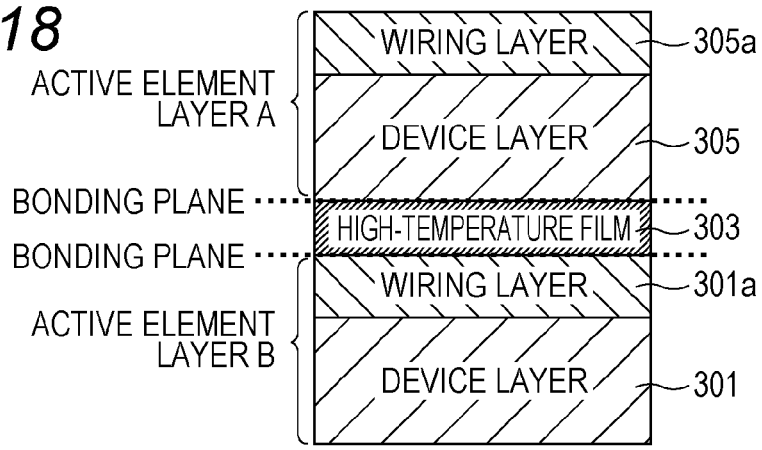
FIG. 18 is a diagram illustrating an example in the case where a solid-state imaging device is formed by stacking two semiconductor substrates.

For example, the semiconductor substrates may be stacked as illustrated in FIG. 18 to form the solid-state imaging device. In the example of FIG. 18, the wiring layer 301*a* of the active element layer B faces the surface of the active element layer A on the opposite side of the wiring layer 305*a* with the high-temperature film 303 as the diffusion prevention film interposed therebetween.

Figure 19:
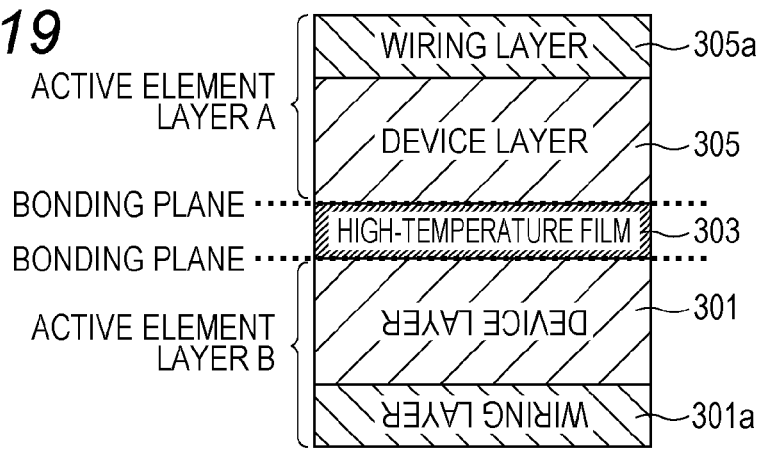
FIG. 19 is a diagram illustrating another example in the case where the solid-state imaging device is formed by stacking two semiconductor substrates.

Alternatively, the semiconductor substrates may be stacked as illustrated in FIG. 19 to form the solid-state imaging device. In the example of FIG. 19, the surface of the active element layer A on the opposite side of the wiring layer 301*a* faces the surface of the active element layer B on the opposite side of the wiring layer 305*a* with the high-temperature film 303 as the diffusion prevention film interposed therebetween.

Although the example in which the solid-state imaging device is formed by stacking the two semiconductor substrates has been described with reference to FIGS. 17 to 19, the solid-state imaging device may be formed by stacking three semiconductor substrates.

Figure 20:
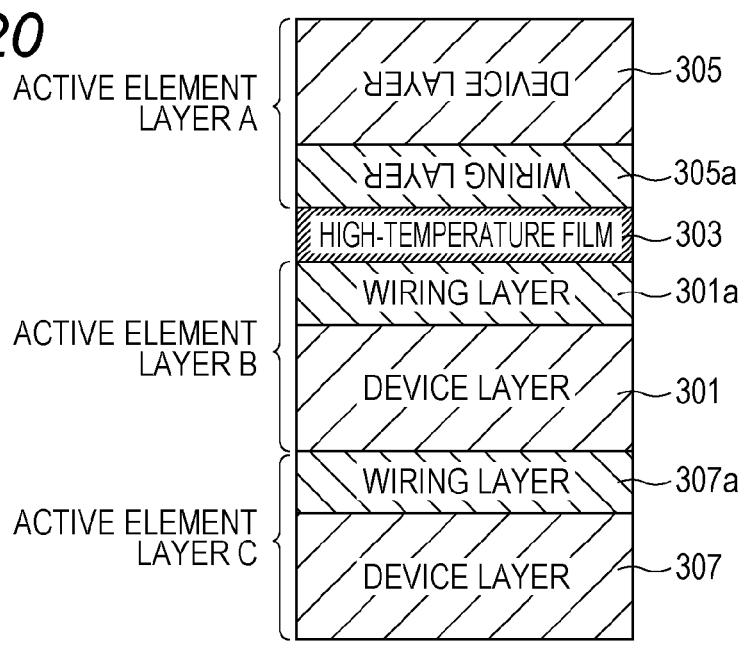
FIG. 20 is a diagram illustrating an example in the case where a solid-state imaging device is formed by stacking three semiconductor substrates.

For example, the solid-state imaging device may be formed by stacking three semiconductor substrates as illustrated in FIG. 20. In the example of FIG. 20, an active element layer C including a device layer 307 provided with a wiring layer 307*a* is stacked in addition to the active element layer A and the active element layer B. Here, in a manner similar to the case illustrated in FIG. 17, the active element layer A and the active element layer B are formed and the surface of the active element layer B on the opposite side of the wiring layer 301*a* is bonded to the wiring layer 307*a* of the active element layer C.

Figure 21:
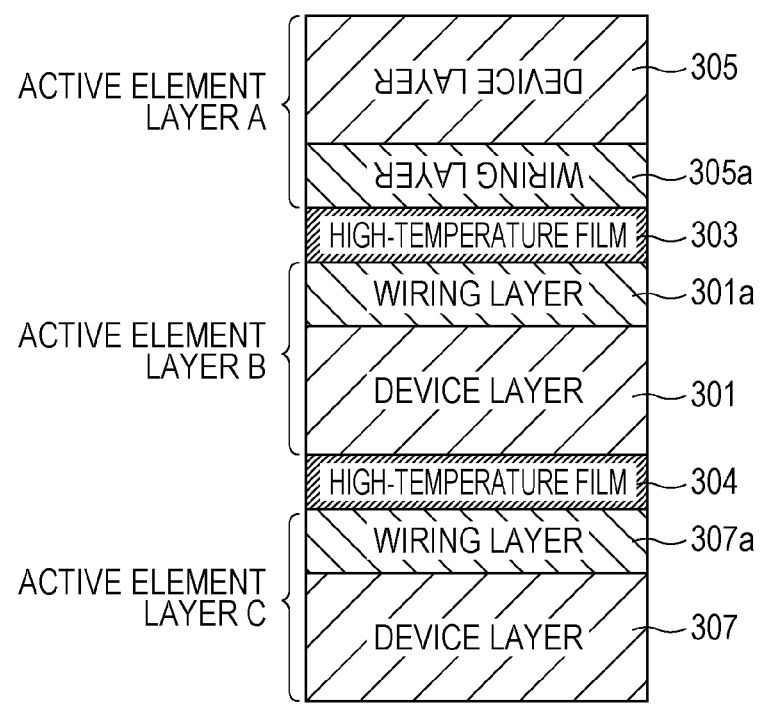
FIG. 21 is a diagram illustrating another example in the case where a solid-state imaging device is formed by stacking three semiconductor substrates.

Alternatively, as illustrated in FIG. 21, a high-temperature film may be provided between the active element layer B and the active element layer C. In the example of FIG. 21, the active element layer A and the active element layer B are disposed to have their wiring layers facing each other with the high-temperature film 303 as the diffusion prevention film interposed therebetween, and the surface of the active element layer B on the opposite side of the wiring layer 301*a* faces the wiring layer 307*a* of the active element layer C with the high-temperature film 304 as the diffusion prevention film interposed therebetween.

Although the example in which the present technique is applied to the solid-state imaging device has been described with reference to FIGS. 14 to 21, the present technique can be applied to other devices than the solid-state imaging device.

For example, the present technique can be applied to a bipolar device such as a wireless transceiver.

Moreover, although the example in which the high-temperature film is formed by LP-SiN formed by LP-CVD has been described in the above embodiment with reference to FIGS. 14 to 21, the high-temperature film may be formed by SiN (also referred to as ALD-SiN) formed by ALD (Atomic Layer Deposition)-CVD.

Moreover, the present technique is not limited to the application to the solid-state imaging device such as an image sensor. In other words, the present technique is applicable to the general electronic appliances including the solid-state imaging device in an image capture portion (photoelectric conversion unit), for example, an imaging device such as a digital still camera or a video camera, a portable terminal device having an imaging function, or a copier using a solid-state imaging device in an image reading portion.

Figure 22:
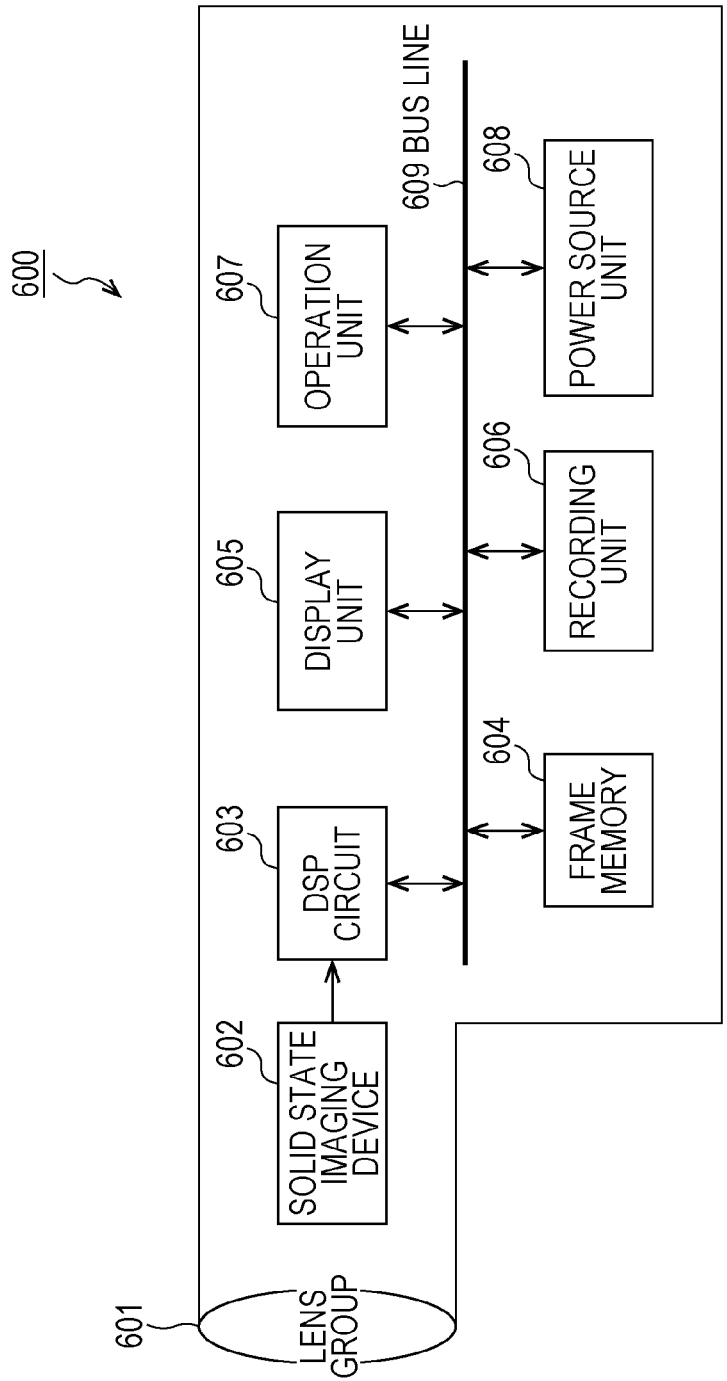
FIG. 22 is a block diagram illustrating a structure example of an electronic appliance to which the present technique has been applied.

FIG. 22 is a block diagram illustrating a structure example of a camera device as an electronic appliance to which the present technique has been applied.

A camera device 600 illustrated in FIG. 22 includes an optical unit 601 including a lens group or the like, a solid-state imaging device (imaging device) 602 employing each structure of the aforementioned pixels 2, and a DSP circuit 603 as the camera signal processing circuit. The camera device 600 moreover includes a frame memory 604, a display unit 605, a recording unit 606, an operation unit 607, and a power source unit 608. The DSP circuit 603, the frame memory 604, the display unit 605, the recording unit 606, the operation unit 607, and the power source unit 608 are connected to each other through a bus line 609.

The optical unit 601 takes in the incident light (image light) from a subject and focuses the light on an imaging surface of the solid-state imaging device 602. The solid-state imaging device 602 converts the light quantity of the incident light focused on the imaging surface by the optical unit 601 into electric signals in units of pixels and outputs the signal as a pixel signal. As the solid-state imaging device 602, the solid-state imaging device according to the above embodiment can be used.

The display unit 605 includes, for example, a panel type display device such as a liquid crystal panel or an organic EL (Electro Luminescence) panel, and displays a moving picture or a still image taken by the solid-state imaging device 602. The recording unit 606 records the moving picture or the still image taken by the solid-state imaging device 602 in a recording medium such as a video tape or a DVD (Digital Versatile Disk).

The operation unit 607 outputs an operation order in regard to various functions of the camera device 600 in response to the operation from a user. The power source unit 608 supplies various kinds of power to operate the DSP circuit 603, the frame memory 604, the display unit 605, the recording unit 606, and the operation unit 607 to any of these supply targets.

The present technique is not limited to the application to the solid-state imaging element that detects the distribution of the incident light quantity of visible light and captures the distribution as an image, and is applicable to the general solid-state imaging elements (physical quantity distribution detection devices) such as a solid-state imaging element that captures the distribution of the incident quantity of infrared ray, X-ray, or particles as an image or, in a broad sense, a fingerprint detection sensor that captures the distribution of another physical quantity such as pressure or electrostatic capacitance as an image.

The embodiment of the present technique is not limited to the above embodiment and various modifications can be made within the scope not departing from the content of the present technique.

Note that the present technique can have the structure as below.

(1)

A semiconductor device including:

a first semiconductor substrate;

a second semiconductor substrate providing a function different from a function provided by the first semiconductor substrate; and a diffusion prevention film that prevents diffusion of a dangling bond terminating atom used for reducing interface state of the first semiconductor substrate and the second semiconductor substrate, wherein at least two semiconductor substrates are stacked and the semiconductor substrates are electrically connected to each other, and the first semiconductor substrate and the second semiconductor substrate are stacked with the diffusion prevention film inserted between an interface of the first semiconductor substrate and an interface of the second semiconductor substrate.

(2)

The semiconductor device according to (1), wherein the interface state of the first semiconductor substrate is lower than that of the second semiconductor substrate.

(3)

The semiconductor device according to (2), wherein an atom supply film that supplies the dangling bond terminating atom is further inserted between the first semiconductor substrate and the diffusion prevention film.

(4)

The semiconductor device according to (3), wherein the dangling bond terminating atom is hydrogen, and an insulating thin film in the first semiconductor substrate formed by a silicon nitride thin film is used as the atom supply film.

(5)

The semiconductor device according to any of (2) to (4), wherein the first semiconductor substrate and the second semiconductor substrate are stacked with an atom occlusion film that occludes the dangling bond terminating atom inserted between the diffusion prevention film and the second semiconductor substrate.

(6)

The semiconductor device according to (5), wherein the dangling bond terminating atom is hydrogen, and barrier metal covering a multilayer wiring layer or an extraction electrode in the second semiconductor substrate, which is formed of titanium, is used as the atom occlusion film.

(7)

The semiconductor device according to any of (2) to (6), wherein the device is structured as a solid-state imaging device, and a pixel portion is provided for the first semiconductor substrate and a logic circuit is provided for the second semiconductor substrate.

(8)

The semiconductor device according to (7), further including a third semiconductor substrate provided with a memory circuit, wherein the second semiconductor substrate is provided between the first semiconductor substrate and the third semiconductor substrate, and the first semiconductor substrate to the third semiconductor substrate are stacked with the diffusion prevention film that prevents diffusion of the dangling bond terminating atom further inserted between an interface of the second semiconductor substrate and an interface of the third semiconductor substrate.

(9)

The semiconductor device according to (1), wherein the diffusion prevention film is a SiN film formed by plasma CVD.

(10)

The semiconductor device according to (1), wherein
the diffusion prevention film is formed on a support substrate by a film formation process at 600° C. or more,
the diffusion prevention film formed on the support substrate and the second semiconductor substrate are bonded to each other and the support substrate is polished to be removed, and
the first semiconductor substrate and the second semiconductor substrate are stacked with the diffusion prevention film inserted between the interface of the first semiconductor substrate and the interface of the second semiconductor substrate.

(11)

The semiconductor device according to (10), wherein the diffusion prevention film is a SiN film formed by LP-CVD.

(12)

The semiconductor device according to (10), wherein the diffusion prevention film has a film density of 2.7 g/cm to 3.5 g/cm.

(13)

The semiconductor device according to (10), wherein the diffusion prevention film has a thickness of 150 nm or less.

(14)

The semiconductor device according to (10), wherein the diffusion prevention film is a SiN film formed by ALD-CVD.

(15)

The semiconductor device according to (1), wherein the first semiconductor substrate and the second semiconductor substrate are stacked with their multilayer wiring layers facing each other.

(16)

The semiconductor device according to (1), wherein the first semiconductor substrate and the second semiconductor substrate are stacked with their multilayer wiring layers not facing each other.

(17)

An electronic appliance including:
a first semiconductor substrate;
a second semiconductor substrate providing a function different from a function provided by the first semiconductor substrate; and
a diffusion prevention film that prevents diffusion of a dangling bond terminating atom used for reducing the interface state of the first semiconductor substrate and the second semiconductor substrate, wherein
at least two semiconductor substrates are stacked and the semiconductor substrates are electrically connected to each other, and
the first semiconductor substrate and the second semiconductor substrate are stacked with the diffusion prevention film inserted between an interface of the first semiconductor substrate and an interface of the second semiconductor substrate.

REFERENCE SIGNS LIST

1 Solid-state imaging device
31 First semiconductor substrate
45 Second semiconductor substrate
99 Diffusion prevention film
200 Solid-state imaging device
201 Device layer
202 Device layer
203 Diffusion prevention film
204 Atom supply film
221 Device layer
222 Device layer
223 Diffusion prevention film
224 Atom supply film
225 Atom occlusion film
240 Solid-state imaging device
241 Device layer
242 Device layer
243 Device layer
244 Diffusion prevention film
245 Atom supply film
246 Diffusion prevention film
247 Atom supply film
301 Device layer
301a Wiring layer
302 Support substrate
303 High-temperature film
304 High-temperature film
305 Device layer
305a Wiring layer
307 Device layer
307a Wiring layer

What is claimed is:

1. A semiconductor device comprising:
a first semiconductor substrate;
a second semiconductor substrate providing a function different from a function provided by the first semiconductor substrate; and
a diffusion prevention film that prevents diffusion of a dangling bond terminating atom used for reducing an interface state of the first semiconductor substrate and the second semiconductor substrate, wherein the interface state of the first semiconductor substrate is lower than the interface state of the second semiconductor substrate,
wherein the first semiconductor substrate and the second semiconductor substrate are stacked and the first semiconductor substrate and the second semiconductor substrate are electrically connected to each other, and
the first semiconductor substrate and the second semiconductor substrate are stacked with the diffusion prevention film inserted between an interface of the first semiconductor substrate and an interface of the second semiconductor substrate.

2. The semiconductor device according to claim 1, wherein an atom supply film that supplies the dangling bond terminating atom is further inserted between the first semiconductor substrate and the diffusion prevention film.

3. The semiconductor device according to claim 2, wherein
the dangling bond terminating atom is hydrogen, and
an insulating thin film in the first semiconductor substrate formed by a silicon nitride thin film is used as the atom supply film.

4. The semiconductor device according to claim 1, wherein the first semiconductor substrate and the second semiconductor substrate are stacked with an atom occlusion film that occludes the dangling bond terminating atom inserted between the diffusion prevention film and the second semiconductor substrate.

5. The semiconductor device according to claim 4, wherein
the dangling bond terminating atom is hydrogen, and
barrier metal covering a multilayer wiring layer or an extraction electrode in the second semiconductor substrate, which is formed of titanium, is used as the atom occlusion film.

6. The semiconductor device according to claim 1, wherein
the device is structured as a solid-state imaging device, and
a pixel portion is provided for the first semiconductor substrate and a logic circuit is provided for the second semiconductor substrate.

7. The semiconductor device according to claim 6, further comprising a third semiconductor substrate provided with a memory circuit, wherein
the second semiconductor substrate is provided between the first semiconductor substrate and the third semiconductor substrate, and
the first semiconductor substrate to the third semiconductor substrate are stacked with the diffusion prevention film that prevents diffusion of the dangling bond terminating atom further inserted between an interface of the second semiconductor substrate and an interface of the third semiconductor substrate.

8. The semiconductor device according to claim 1, wherein the diffusion prevention film is a SiN film formed by plasma CVD.

9. The semiconductor device according to claim 1, wherein
the diffusion prevention film is formed on a support substrate by a film formation process at 600° C. or more,
the diffusion prevention film formed on the support substrate and the second semiconductor substrate are bonded to each other and the support substrate is polished to be removed, and
the first semiconductor substrate and the second semiconductor substrate are stacked with the diffusion prevention film inserted between the interface of the first semiconductor substrate and the interface of the second semiconductor substrate.

10. The semiconductor device according to claim 9, wherein the diffusion prevention film is a SiN film formed by LP-CVD.

11. The semiconductor device according to claim 9, wherein the diffusion prevention film has a film density of 2.7 g/cm to 3.5 g/cm.

12. The semiconductor device according to claim 9, wherein the diffusion prevention film has a thickness of 150 nm or less.

13. The semiconductor device according to claim 9, wherein the diffusion prevention film is a SiN film formed by ALD-CVD.

14. The semiconductor device according to claim 1, wherein the first semiconductor substrate and the second semiconductor substrate are stacked with their multilayer wiring layers facing each other.

15. The semiconductor device according to claim 1, wherein the first semiconductor substrate and the second semiconductor substrate are stacked with their multilayer wiring layers not facing each other.

16. An electronic appliance comprising:
a first semiconductor substrate;
a second semiconductor substrate providing a function different from a function provided by the first semiconductor substrate; and
a diffusion prevention film that prevents diffusion of a dangling bond terminating atom used for reducing the interface state of the first semiconductor substrate and the second semiconductor substrate, wherein the interface state of the first semiconductor substrate is lower than the interface state of the second semiconductor substrate,
wherein the first semiconductor substrate and the second semiconductor substrate are stacked and the first semiconductor substrate and the second semiconductor substrate are electrically connected to each other, and
the first semiconductor substrate and the second semiconductor substrate are stacked with the diffusion prevention film inserted between an interface of the first semiconductor substrate and an interface of the second semiconductor substrate.

* * * * *